(12) United States Patent
Salcedo et al.

(10) Patent No.: US 10,249,609 B2
(45) Date of Patent: Apr. 2, 2019

(54) APPARATUSES FOR COMMUNICATION SYSTEMS TRANSCEIVER INTERFACES

(71) Applicant: ANALOG DEVICES, INC., Norwood, MA (US)

(72) Inventors: Javier Alejandro Salcedo, North Billerica, MA (US); Linfeng He, Orlando, FL (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/674,218

(22) Filed: Aug. 10, 2017

(65) Prior Publication Data
US 2019/0051646 A1    Feb. 14, 2019

(51) Int. Cl.
*H01L 29/74* (2006.01)
*H01L 31/111* (2006.01)
*H01L 27/02* (2006.01)
*H01L 29/40* (2006.01)
*H01L 29/06* (2006.01)

(52) U.S. Cl.
CPC ...... *H01L 27/0262* (2013.01); *H01L 27/0255* (2013.01); *H01L 27/0288* (2013.01); *H01L 29/404* (2013.01); *H01L 29/0619* (2013.01)

(58) Field of Classification Search
CPC ............. H01L 27/0262; H01L 27/0255; H01L 27/0288; H01L 29/404
USPC ........................................................ 257/146
See application file for complete search history.

(56) References Cited

U.S. PATENT DOCUMENTS

| 3,436,667 A | 4/1969 | Leonard |
| 4,331,884 A | 5/1982 | Svedberg |
| 4,633,283 A | 12/1986 | Avery |
| 5,061,652 A | 10/1991 | Bendernagel et al. |

(Continued)

FOREIGN PATENT DOCUMENTS

| DE | 10 2007 040 875 A1 | 3/2009 |
| DE | 10 2013 101 326 A1 | 8/2013 |

(Continued)

OTHER PUBLICATIONS

Anderson et al., ESD Protection under Wire Bonding Pads, EOS/ESD Symposium 99-88, pp. 2A.4.1-2A.4.7 (1999).

(Continued)

*Primary Examiner* — David S Blum
(74) *Attorney, Agent, or Firm* — Knobbe, Martens, Olson & Bear LLP

(57) ABSTRACT

An integrated circuit device for protecting circuits from transient electrical events is disclosed. An integrated circuit device includes a first bipolar junction transistor (BJT) and a second BJT cross-coupled with the first BJT to operate as a first semiconductor-controlled rectifier (SCR), where a base of the first BJT is connected to a collector of the second BJT, and a base of the second BJT is connected to an emitter or a collector of the first BJT. The integrated circuit device additionally includes a triggering device comprising a first diode having a cathode electrically connected to the base of the first BJT. The integrated circuit device further includes a third BJT cross-coupled with the second BJT to operate as a second SCR, where the third BJT has a collector connected to the base of the second BJT and a base connected to the collector of the second BJT.

26 Claims, 21 Drawing Sheets

(56) References Cited

U.S. PATENT DOCUMENTS

| | | |
|---|---|---|
| 5,182,220 A | 1/1993 | Ker et al. |
| 5,276,582 A | 1/1994 | Merrill et al. |
| 5,341,005 A | 8/1994 | Canclini |
| 5,343,053 A | 8/1994 | Avery |
| 5,369,041 A | 11/1994 | Duvvury |
| 5,541,801 A | 7/1996 | Lee et al. |
| 5,576,557 A | 11/1996 | Ker et al. |
| 5,615,074 A | 3/1997 | Avery |
| 5,652,689 A | 7/1997 | Yuan |
| 5,663,860 A | 9/1997 | Swonger |
| 5,742,084 A | 4/1998 | Yu |
| 5,745,323 A | 4/1998 | English et al. |
| 5,781,389 A | 7/1998 | Fukuzako et al. |
| 5,786,617 A | 7/1998 | Merrill et al. |
| 5,889,644 A | 3/1999 | Schoenfeld et al. |
| 5,895,840 A | 4/1999 | Ohuchi et al. |
| 5,895,940 A | 4/1999 | Kim |
| 5,998,813 A | 12/1999 | Bernier |
| 6,097,068 A | 8/2000 | Brown et al. |
| 6,104,589 A | 8/2000 | Williamson |
| 6,137,140 A | 10/2000 | Efland et al. |
| 6,144,542 A | 11/2000 | Ker et al. |
| 6,172,403 B1 | 1/2001 | Chen |
| 6,236,087 B1 | 5/2001 | Daly et al. |
| 6,258,634 B1 | 7/2001 | Wang et al. |
| 6,310,379 B1 | 10/2001 | Andresen et al. |
| 6,329,694 B1 | 12/2001 | Lee et al. |
| 6,403,992 B1 | 6/2002 | Wei |
| 6,404,261 B1 | 6/2002 | Grover et al. |
| 6,423,987 B1 | 7/2002 | Constapel et al. |
| 6,512,662 B1 | 1/2003 | Wang |
| 6,538,266 B2 | 3/2003 | Lee et al. |
| 6,590,273 B2 | 7/2003 | Okawa et al. |
| 6,621,126 B2 | 9/2003 | Russ |
| 6,665,160 B2 | 12/2003 | Lin et al. |
| 6,667,870 B1 | 12/2003 | Segervall |
| 6,704,180 B2 | 3/2004 | Tyler et al. |
| 6,724,603 B2 | 4/2004 | Miller et al. |
| 6,756,834 B1 | 6/2004 | Tong et al. |
| 6,765,771 B2 | 7/2004 | Ker et al. |
| 6,768,616 B2 | 7/2004 | Mergens et al. |
| 6,784,489 B1 | 8/2004 | Menegoli |
| 6,870,202 B2 | 3/2005 | Oka |
| 6,960,792 B1 | 11/2005 | Nguyen |
| 6,960,811 B2 | 11/2005 | Wu et al. |
| 6,979,869 B2 | 12/2005 | Chen et al. |
| 7,034,363 B2 | 4/2006 | Chen |
| 7,038,280 B2 | 5/2006 | Righter |
| 7,071,528 B2 | 7/2006 | Ker et al. |
| 7,125,760 B1 | 10/2006 | Reese et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,566,914 B2 | 7/2009 | Salcedo et al. |
| 7,570,467 B2 | 8/2009 | Watanabe et al. |
| 7,601,991 B2 | 10/2009 | Salcedo et al. |
| 7,663,190 B2 | 2/2010 | Vinson |
| 7,714,357 B2 | 5/2010 | Hayashi et al. |
| 7,834,378 B2 | 11/2010 | Ryu et al. |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,217,461 B1 | 7/2012 | Chu et al. |
| 8,218,276 B2 | 7/2012 | Mallikarjunaswamy |
| 8,222,698 B2 | 7/2012 | Salcedo et al. |
| 8,331,069 B2 | 12/2012 | Galy et al. |
| 8,368,116 B2 | 2/2013 | Salcedo et al. |
| 8,416,543 B2 | 4/2013 | Salcedo |
| 8,432,651 B2 | 4/2013 | Salcedo et al. |
| 8,466,489 B2 | 6/2013 | Salcedo et al. |
| 8,553,380 B2 | 10/2013 | Salcedo |
| 8,592,860 B2 | 11/2013 | Salcedo et al. |
| 8,610,251 B1 | 12/2013 | Salcedo |
| 8,633,509 B2 | 1/2014 | Salcedo |
| 8,637,899 B2 | 1/2014 | Salcedo |
| 8,665,571 B2 | 3/2014 | Salcedo et al. |
| 8,680,620 B2 | 3/2014 | Salcedo et al. |
| 8,686,470 B2 | 4/2014 | Ritter |
| 8,772,091 B2 | 7/2014 | Salcedo et al. |
| 8,796,729 B2 | 8/2014 | Clarke et al. |
| 8,829,570 B2 | 9/2014 | Salcedo et al. |
| 8,860,080 B2 | 10/2014 | Salcedo et al. |
| 8,890,248 B2 | 11/2014 | Pauletti et al. |
| 8,946,822 B2 | 2/2015 | Salcedo et al. |
| 8,947,841 B2 | 2/2015 | Salcedo et al. |
| 8,963,200 B2 | 2/2015 | Lee et al. |
| 9,006,781 B2 | 4/2015 | Salcedo et al. |
| 9,006,782 B2 | 4/2015 | Salcedo |
| 9,831,233 B2 | 11/2017 | Salcedo |
| 9,831,666 B2 | 11/2017 | Parthasaraathy et al. |
| 9,871,373 B2 | 1/2018 | O'Donnell et al. |
| 9,929,142 B2 | 3/2018 | Ivanov et al. |
| 9,954,356 B2 | 4/2018 | Parthasarathy et al. |
| 10,008,490 B2 | 6/2018 | Salcedo et al. |
| 2001/0040254 A1 | 11/2001 | Takiguchi |
| 2002/0021538 A1 | 2/2002 | Chen et al. |
| 2002/0081783 A1 | 6/2002 | Lee et al. |
| 2002/0109190 A1 | 8/2002 | Ker et al. |
| 2002/0122280 A1 | 9/2002 | Ker et al. |
| 2002/0153571 A1 | 10/2002 | Mergens et al. |
| 2002/0187601 A1 | 12/2002 | Lee et al. |
| 2003/0038298 A1 | 2/2003 | Cheng et al. |
| 2003/0076636 A1 | 4/2003 | Ker et al. |
| 2004/0135229 A1 | 7/2004 | Sasahara |
| 2004/0164351 A1 | 8/2004 | Petruzzello et al. |
| 2004/0164354 A1 | 8/2004 | Mergens et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0133869 A1 | 6/2005 | Ker et al. |
| 2005/0151160 A1 | 7/2005 | Salcedo et al. |
| 2005/0173727 A1 | 8/2005 | Manna et al. |
| 2005/0195540 A1 | 9/2005 | Streibl et al. |
| 2005/0269641 A1 | 12/2005 | Lai et al. |
| 2006/0033163 A1 | 2/2006 | Chen |
| 2006/0109595 A1 | 5/2006 | Watanabe et al. |
| 2006/0145260 A1 | 7/2006 | Kim |
| 2006/0151836 A1 | 7/2006 | Salcedo et al. |
| 2006/0186467 A1 | 8/2006 | Pendharkar et al. |
| 2007/0007545 A1 | 1/2007 | Salcedo et al. |
| 2007/0034956 A1 | 2/2007 | Lee et al. |
| 2007/0058307 A1 | 3/2007 | Mergens et al. |
| 2007/0158748 A1 | 7/2007 | Chu et al. |
| 2008/0044955 A1 | 2/2008 | Salcedo et al. |
| 2008/0067601 A1 | 3/2008 | Chen |
| 2008/0203534 A1 | 8/2008 | Xu et al. |
| 2009/0032838 A1 | 2/2009 | Tseng et al. |
| 2009/0034137 A1 | 2/2009 | Disney et al. |
| 2009/0045457 A1 | 2/2009 | Bodbe |
| 2009/0057715 A1 | 3/2009 | Ryu et al. |
| 2009/0206376 A1 | 8/2009 | Mita et al. |
| 2009/0230426 A1 | 9/2009 | Carpenter et al. |
| 2009/0236631 A1 | 9/2009 | Chen et al. |
| 2009/0309128 A1 | 12/2009 | Salcedo et al. |
| 2010/0133583 A1 | 6/2010 | Mawatari et al. |
| 2010/0163973 A1 | 7/2010 | Nakamura et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0176244 A1 | 7/2011 | Gendron et al. |
| 2011/0207409 A1 | 8/2011 | Ker et al. |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0007207 A1 | 1/2012 | Salcedo |

(56) References Cited

U.S. PATENT DOCUMENTS

| | | | |
|---|---|---|---|
| 2012/0008242 | A1 | 1/2012 | Salcedo |
| 2012/0199874 | A1 | 8/2012 | Salcedo et al. |
| 2012/0205714 | A1 | 8/2012 | Salcedo et al. |
| 2012/0211869 | A1 | 8/2012 | Lee et al. |
| 2012/0293904 | A1 | 11/2012 | Salcedo et al. |
| 2013/0032882 | A1 | 2/2013 | Salcedo et al. |
| 2013/0208385 | A1 | 8/2013 | Salcedo et al. |
| 2013/0234209 | A1 | 9/2013 | Parthasarathy et al. |
| 2013/0242448 | A1 | 9/2013 | Salcedo et al. |
| 2013/0270605 | A1 | 10/2013 | Salcedo et al. |
| 2013/0330884 | A1 | 12/2013 | Salcedo et al. |
| 2014/0138735 | A1 | 5/2014 | Clarke et al. |
| 2014/0167104 | A1 | 6/2014 | Salcedo |
| 2014/0167105 | A1 | 6/2014 | Salcedo et al. |
| 2014/0167106 | A1 | 6/2014 | Salcedo |
| 2014/0339601 | A1 | 11/2014 | Salcedo et al. |
| 2014/0346563 | A1 | 11/2014 | Salcedo |
| 2015/0076557 | A1 | 3/2015 | Salcedo et al. |
| 2016/0141358 | A1 | 5/2016 | Salcedo et al. |
| 2016/0204096 | A1 | 7/2016 | Zhao et al. |
| 2016/0300830 | A1 | 10/2016 | Salcedo |
| 2017/0317070 | A1* | 11/2017 | Salcedo .............. H01L 24/49 |
| 2017/0366002 | A1 | 12/2017 | Zhao et al. |
| 2018/0026440 | A1 | 1/2018 | Zhao et al. |
| 2018/0158814 | A1 | 6/2018 | Salcedo et al. |
| 2018/0211951 | A1 | 7/2018 | Luo et al. |
| 2018/0226788 | A1 | 8/2018 | Salcedo et al. |

FOREIGN PATENT DOCUMENTS

| | | |
|---|---|---|
| EP | 0 168 678 A2 | 1/1986 |
| EP | 0 915 508 A1 | 5/1999 |
| EP | 1 703 560 A2 | 9/2006 |
| JP | 2007-012864 | 1/2007 |
| KR | 10-2005-0098458 A | 10/2005 |
| KR | 10-2006-0067100 | 2/2006 |
| KR | 10-2009-0123683 | 12/2009 |
| KR | 10-2010-0003569 | 1/2010 |
| WO | WO 2012/005936 A1 | 1/2012 |

OTHER PUBLICATIONS

Betak, Petr, "An Advanced SCR Protective Structure Against ESD Stress". Proceedings of the 13th Conference Student EEICT 2007, vol. 4, Jan. 2007, pp. 286-290.

Chang et al., High-k Metal Gate-bounded Silicon Controlled Rectifier for ESD Protection, 34th Electrical Overstress/Electrostatic Discharge Symposium, Sep. 2012, 7 pages.

Chia-Tsen Dai, Ming-Dou Ker, IEEE International Conference on Microelectronic Test Structures (ICMTS), 4 pages, Mar. 2013.

European Examination Report dated Sep. 27, 2016 for Application No. 14167969.6 in 6 pages.

European Patent Office Search Report for Application No. EP 14 16 7869 dated Oct. 24, 2014 10 pages.

Jang, Sheng "Novel diode-chain Triggering SCR circuits for ESD protection" Solid-State Elec vol. 44, Iss.7 Jul. 1, 2000 pp. 1297-1303.

Luh et al. A Zener-Diode-Activated ESD Protection Circuit for Sub-Micron CMOS Processes, Circuits and Systems, IEEE International Symposium, May 28-31, 2000, Geneva, Switzerland, 4 pages.

Parthasarathy, S., Salcedo, J.A., Hajjar, J., Analog Devices, Wilmington, MA, USA, Design of SCR Devices for SiGe BiCOMS Applications, Bipolar/BiCOMS Circuits and Technology Meeting (BCTM), 2011 IEEE, p. 235-238.

R. Rudolf, C. Wagner, L. O'Riain, K. Gebhardt, B. Kuhn-Heinrich, B. von Ehrenwall, A. von Ehrenwall, M. Strasser, M. Stecher, U. Glaser, S. Aresu, P. Kuepper, A. Mayerhofer, IEEE International Symposium on Power Semiconductor Devices and ICs, 4 pages, May 2011.

Salcedo et al., "Bidirectional Devices for Automotive-Grade Electrostatic Discharge Applications", IEEE Electron Device Letters, vol. 33, No. 6, Jun. 2012, 3 pages.

Salcedo et al., Electrostatic Discharge Protection Framework for Mixed-Signal High Voltage CMOS Applications, IEEE Xplore, downloaded Feb. 23, 2010 at 12:53 EST, 4 pages.

Salcedo et al., On-Chip Protection for Automotive Integrated Circuits Robustness, 2012 8th International Caribbean Conference on Devices, Circuits and Systems (ICCDCS), 5 pages, Mar. 2012.

Xi et al. "Design and Characterization of ESD Solutions with EMC Robustness for Automotive Applications", Microelectronics Reliability 55 (2015) 2236-2246.

\* cited by examiner

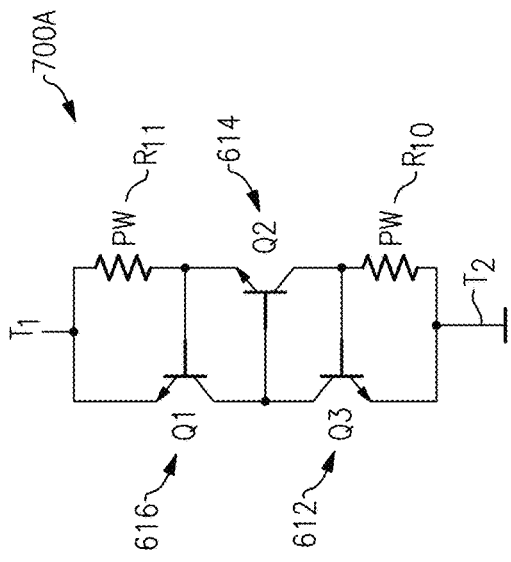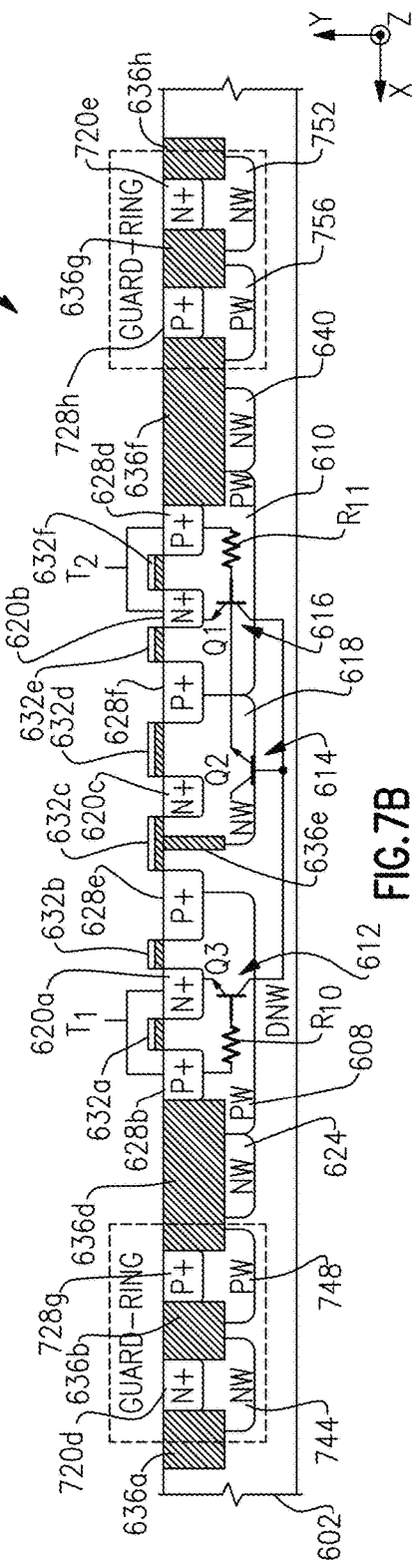
FIG. 7A
FIG. 7B

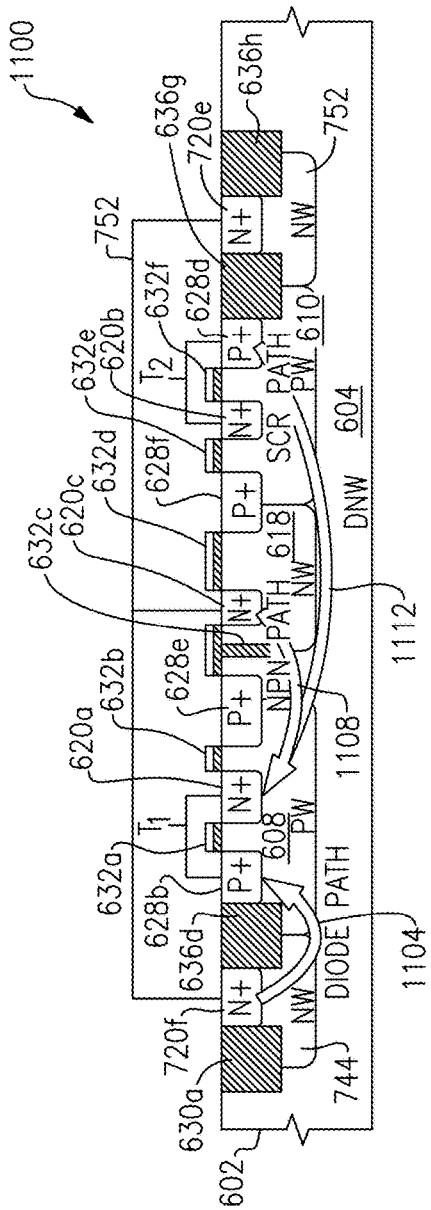

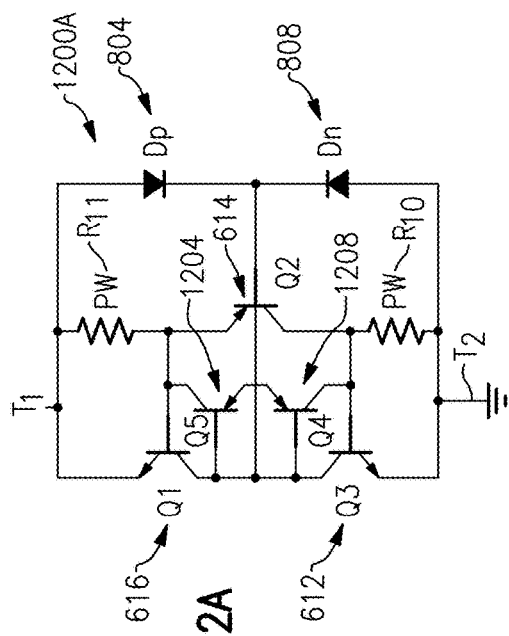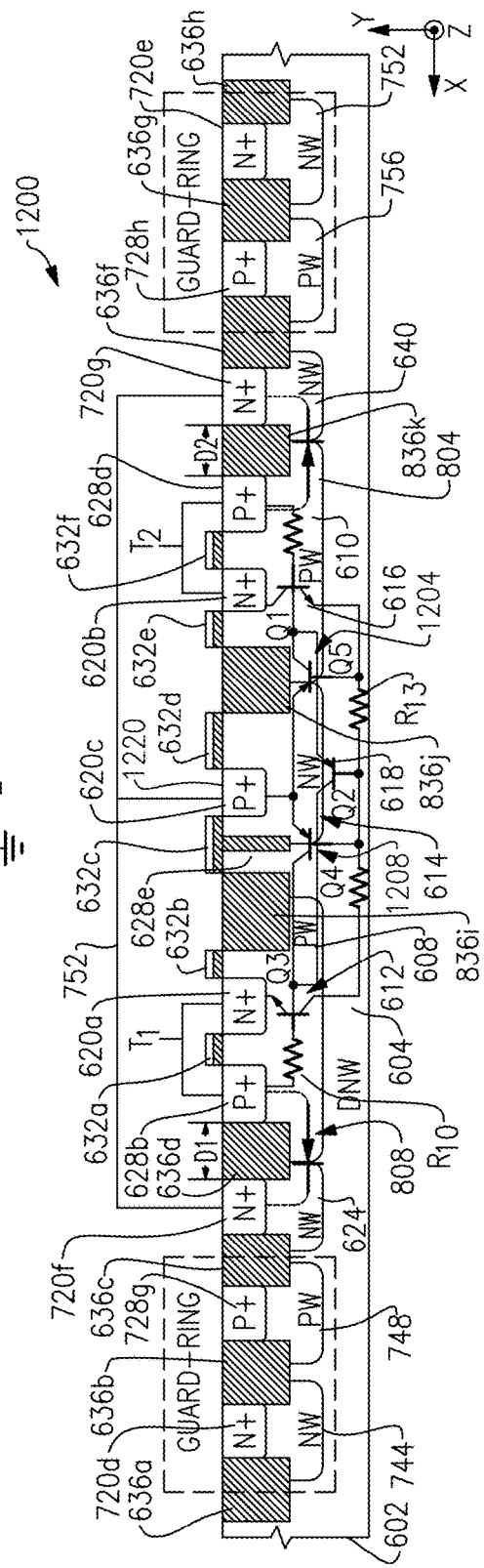
FIG.12A
FIG.12B

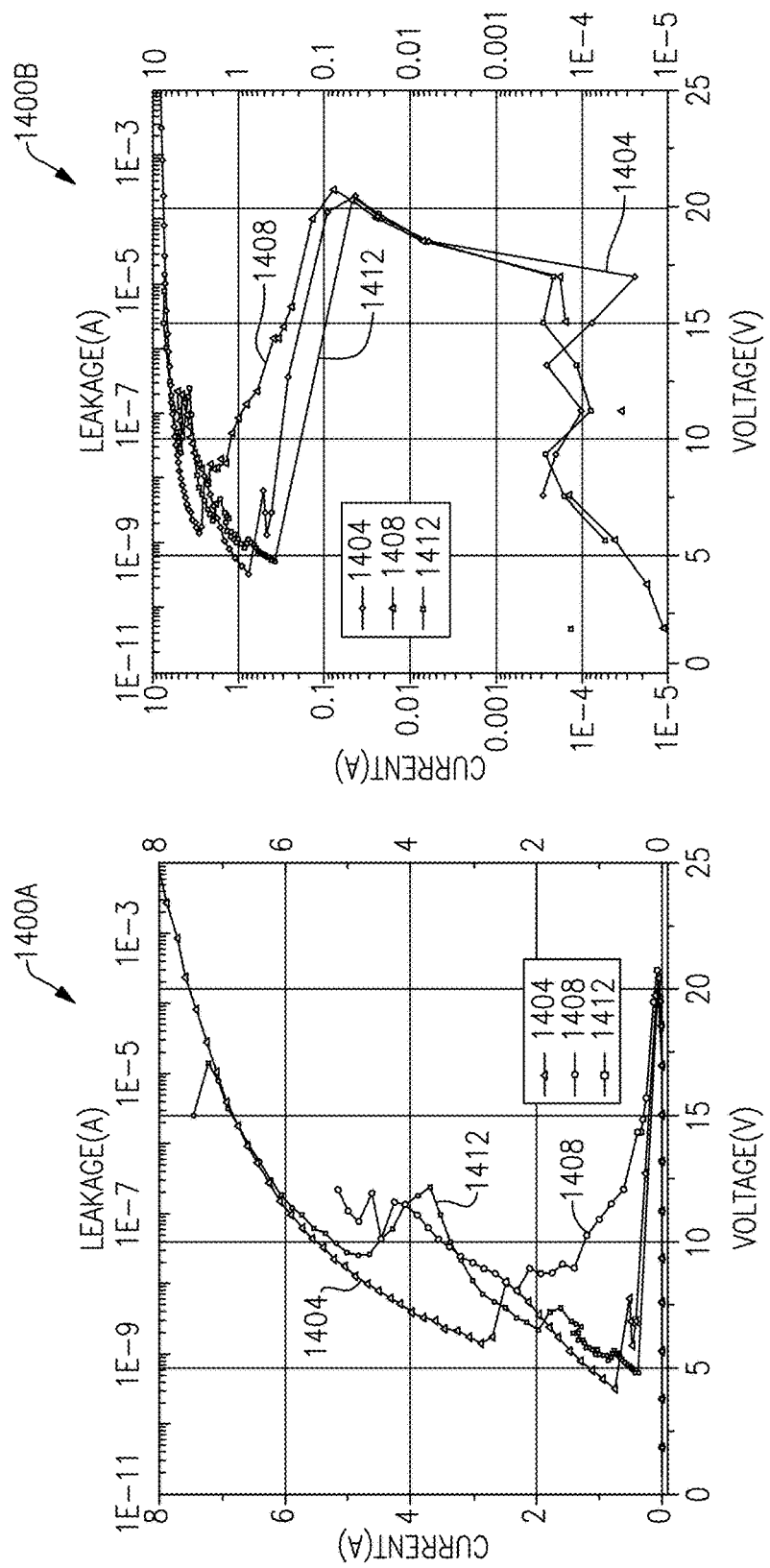

APPARATUSES FOR COMMUNICATION SYSTEMS TRANSCEIVER INTERFACES

BACKGROUND

Field

The disclosed technology relates to electronics, and more particularly to protection devices for communication systems transceiver interfaces for providing protection from transient electrical events, such as electrical overstress/electrostatic discharge.

Description of the Related Technology

Certain electronic systems can be exposed to transient electrical events that last a relatively short duration and have rapidly changing voltages and/or currents. Transient electrical events can include, for example, electrostatic discharge (ESD) or electromagnetic interference events arising from the abrupt release of charge from an object or person to an electronic system.

Transient electrical events can damage integrated circuits (ICs) inside an electronic system due to overvoltage conditions and/or high levels of power dissipation over relatively small areas of the ICs. This rapid and high dissipation of power can potentially lead to damages to core circuits arising from, e.g., gate oxide punch-through, junction damage, metal damage, and surface charge accumulation, among other damaging phenomena. Moreover, transient electrical events can induce latch-up (in other words, inadvertent creation of a low-impedance path), thereby disrupting the functioning of the ICs and causing permanent damage to the ICs.

SUMMARY

In one aspect, an integrated circuit device includes a first bipolar junction transistor (BJT) and a second BJT cross-coupled with the first BJT to operate as a first semiconductor-controlled rectifier (SCR), where a base of the first BJT is connected to a collector of the second BJT, and a base of the second BJT is connected to an emitter or a collector of the first BJT. The integrated circuit device additionally includes a triggering device comprising a first diode having a cathode electrically connected to the base of the first BJT. The integrated circuit device further includes a third BJT cross-coupled with the second BJT to operate as a second SCR, where the third BJT has a collector connected to the base of the second BJT and a base connected to the collector of the second BJT.

In another aspect, an integrated circuit device includes a semiconductor substrate having formed therein a bidirectional semiconductor-controlled rectifier (SCR), where the bidirectional SCR is formed between a first terminal and a second terminal, and where the bidirectional SCR comprises a central well of a first type having formed therein a central heavily doped region of a second type. The integrated circuit device additionally includes one or more metallization levels formed above the semiconductor substrate and a pair of diodes, where a cathode of each of the diodes is electrically connected to the central well of the first type through the one or more of the metallization levels.

In another aspect, an integrated circuit device includes a semiconductor substrate having formed therein three or more wells comprising a first well of a first type interposed between a first well of a second type and a second well of the second type. The integrated circuit device additionally includes one or more metallization levels formed above the semiconductor substrate. The integrated circuit device additionally includes a plurality of bipolar junction transistors (BJTs) formed in the three or more wells and configured to operate as a bidirectional semiconductor-controlled rectifier (SCR), and as a SCR formed in the three or more wells, where each of the bidirectional SCR and the SCR comprises a pair of bipolar junction transistors (BJTs), where each one of the pair of BJTs has a base connected to a collector of the other of the pair of BJTs. The integrated circuit device additionally includes a second well of the first type and a third well of the first type formed in the semiconductor substrate and interposed by the three or more wells. A first diode is formed in the second well of the first type and the first well of the second type and a second diode formed in the third well of the first type and the second well of the second type. Cathodes of the first and second diodes are electrically connected to each other through the one or more of the metallization levels.

BRIEF DESCRIPTION OF THE DRAWINGS

FIG. 7A is an equivalent circuit diagram of a bidirectional protection device, according to embodiments.

FIG. 7B is a schematic cross-sectional view of the bidirectional protection device illustrated in FIG. 7A, according to embodiments.

FIG. 11A is a schematic cross-sectional view of a bidirectional protection device having a triggering device comprising diodes, according to embodiments.

FIG. 11B illustrates relative proportions of simulated currents flowing through different current paths in the bidirectional protection device illustrated in FIG. 11A.

FIG. 12A is an equivalent circuit diagram of a bidirectional protection device having a triggering device comprising diodes and a plurality of SCR current paths, according to embodiments.

FIG. 12B is a schematic cross-sectional view of the bidirectional protection device illustrated in FIG. 12A, according to embodiments.

FIG. 14A is a graph (linear scale) illustrating experimental current-voltage (IV) curves of under transmission line pulse (TLP) testing conditions of bidirectional protection devices having different configurations, according to embodiments.

FIG. 14B is a graph (logarithmic scale) illustrating experimental current-voltage (IV) curves illustrated in FIG. 14A.

DETAILED DESCRIPTION

Figure 1A:
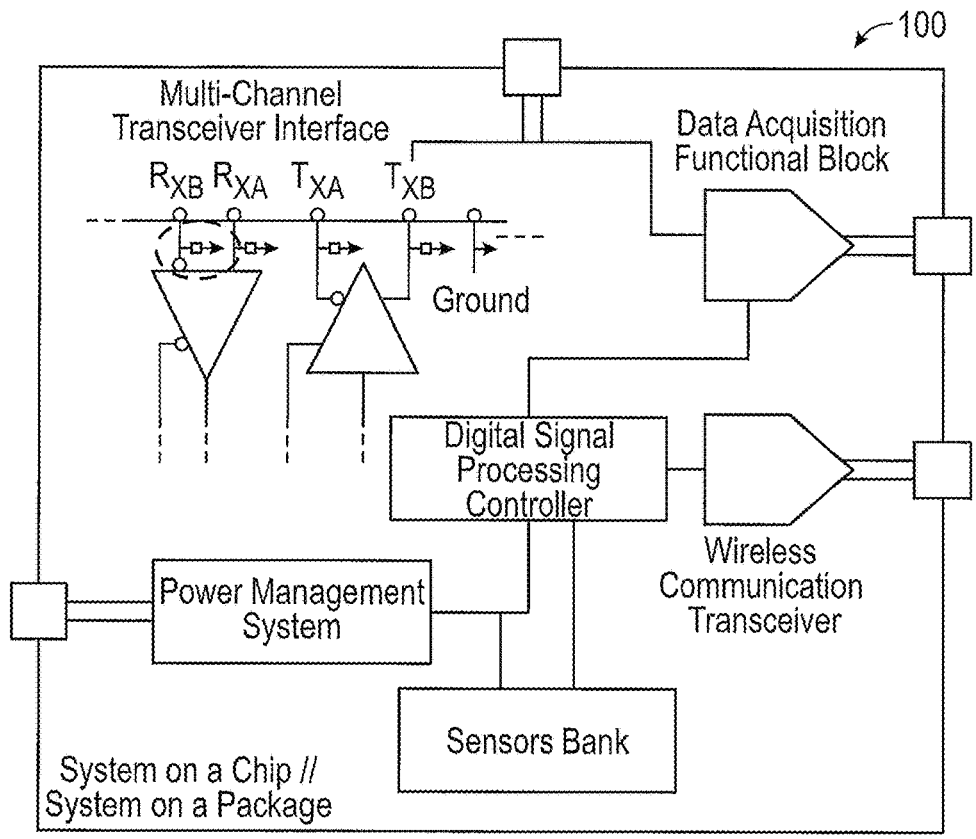
FIG. 1A is a schematic system on chip (SOC) or a system in package (SIP) having one or more system-level bidirectional protection devices, according to embodiments.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described below, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described below.

Emerging integrated circuits (ICs) for various applications including automotive and consumer electronics that are fabricated using low voltage CMOS processes are increasingly using input/output (I/O) interface pins that operate at relatively high bidirectional voltages. These ICs often operate in relatively harsh environments and should comply with applicable electrostatic discharge (ESD) and electromagnetic interference immunity (EMI) specifications. Robust ESD and EMI immunity is desirable because the ICs can be subject to a wide range of high voltage transient electrical events that exceed ordinary operating conditions.

The transient electrical events can be, e.g., a rapidly changing high energy signal such as an electrostatic discharge (ESD) event. The transient electrical event can be associated with an overvoltage event caused by a user contact. In other circumstances, the transient electrical event can be generated by a manufacturer to test the robustness of the transceiver integrated circuit under a defined stress condition, which can be described by standards set by various organizations, such as the Joint Electronic Device Engineering Council (JEDEC), the International Electrotechnical Commission (IEC), and the Automotive Engineering Council (AEC).

Various techniques can be employed to protect a core or a main circuitry of the ICs against these damaging transient electrical events. Some systems employ external off-chip protection devices to ensure that core electronic systems are not damaged in response to the transient electrostatic and electromagnetic events. However, due to performance, cost, and spatial considerations, there is an increasing need for protection devices that are monolithically integrated with the main circuitry, that is, the circuitry to be protected Electronic circuit reliability is enhanced by providing protection devices to the pins or pads of an IC. The protection devices can maintain the voltage level at the pads within a predefined safe range by transitioning from a high-impedance state to a low-impedance state when the voltage of the transient electrical event reaches a trigger voltage. Thereafter, the protection device can shunt at least a portion of the current associated with the transient electrical event before the voltage of a transient electrical event reaches a positive or negative failure voltage that can lead to one of the most common causes of IC damage. The protection devices can be configured, for example, to protect an internal circuit against transient signals that exceed the IC power high and power low (for instance, ground) voltage supply levels. It can be desirable for a protection device to be configurable for different current and voltage (I-V) blocking characteristics and able to render protection against positive and negative transient electrical events with fast operational performance and low static power dissipation at normal operating voltage conditions.

One technology area where the protection requirements are increasingly becoming more complex in terms of speed balanced with current and voltage handling capabilities is technologies using a system on chip (SOC) or a system in package (SIP).

FIG. 1A is a schematic diagram of a system on a chip (SOC)/a system in package (SIP) 100 having integrated therein a bidirectional protection device, according to embodiments disclosed herein. The SOC/SIP 100 comprises a signal processing platform integrating various components for various applications, including consumer communication systems, healthcare vital signal processing, robotics and mission-critical industrial, instrumentation, aerospace and automotive platforms, among other applications. The SOC/SIP 100 includes one or more bidirectional protection devices (e.g., the dotted circled component), which can be system-level protection devices, at a transceiver interface, e.g., a multichannel transceiver interface ($R_{XA}$, $R_{XB}$, $T_{XA}$, $T_{XB}$, etc.) for protecting various components. The SOC/SIP 100 typically includes one or more of a main central digital signal processing controller, for instance a microprocessor and memory unit, which may be communicatively coupled to a data acquisition functional block for analog data sampling and data conversion, wireless transceivers for remote control, a sensor bank for alternatively sensing critical parametric of interest, for instance, temperature, pressure, strength, gas concentration, position, light intensity or chemical composition, a power management and energy harvesting system to condition the power conditions in the system, among other functional blocks. A SIP or heterogeneously integrated SOC having these and other functional blocks may be implemented in one or more semiconductor process technologies and have integrated therein bidirectional protection devices for reliable operation under variable environmental conditions associated with different end applications.

Figure 1B:
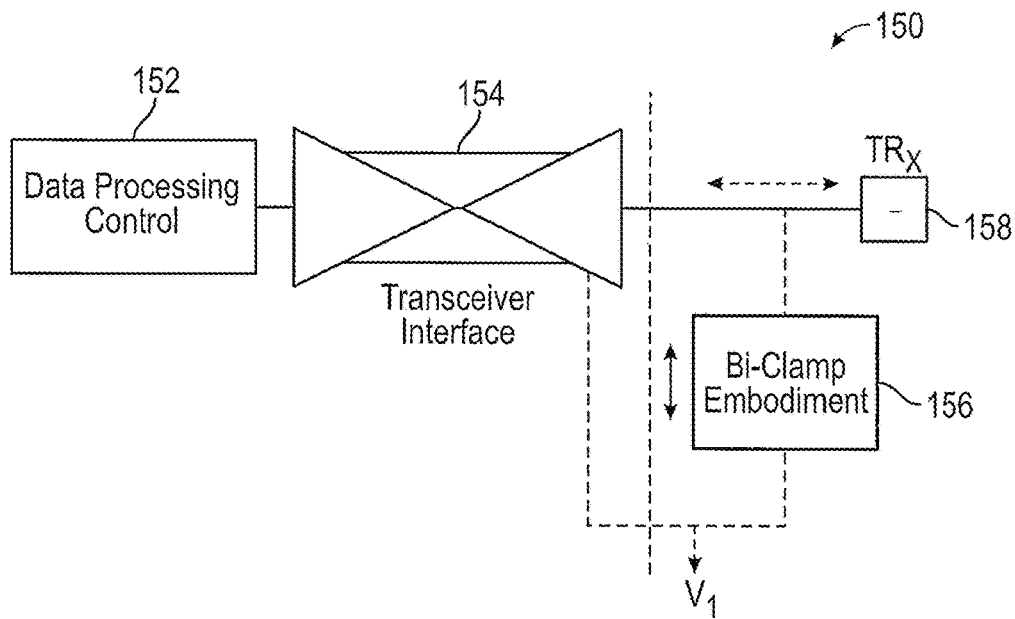
FIG. 1B is a schematic illustration of a transceiver integrated circuit having a bidirectional protection device, according to embodiments.

FIG. 1B is a schematic diagram of a transceiver IC 150 having integrated therein a bidirectional protection device 156, according to embodiments. The transceiver IC 150 includes a transceiver interface circuit 154 coupled to a core circuit 152, e.g., a multi-purpose data-processing control circuit, which may be used for various applications including data sampling and duplex communication applications in consumer communication systems, healthcare vital signal processing and mission-critical industrial, instrumentation and aerospace and automotive platforms, among others. The transceiver interface circuit 154 is configured to be coupled to a transceiver 158 for receiving and/or transmitting signals therebetween. When coupled to the transceiver 158, the transceiver interface circuit 154 is simultaneously directly electrically connected to the bidirectional protection device 156 for protecting the transceiver interface circuit 154. The core circuit 152 is configured to generate control signals for the transceiver interface 154 so as to control its operation of signaling.

Still referring to FIG. 1B, the bidirectional protection device 156 is electrically connected between the transceiver 158 and a power low voltage $V_1$, which can be, for example, a low impedance power low supply, such as ground. When a transient electrical event is received by the transceiver 158, e.g., through interface pins, the bidirectional protection device 156 can divert or shunt current associated with the transient electrical event to the power low voltage $V_1$, e.g., system ground (GND), thereby preventing damage to the internal circuit components electrically connected to the interface pins.

The transceiver interface circuit 154 can operate at input signals with a wide variety of common-mode voltage ranges. The ranges of overvoltage conditions under various operational environments include, e.g., the ranges defined by the ISO-7637 and ISO-16750 standards. To be responsive under these environments, it may be desirable to design the protection device 156 to operate at variable bidirectional blocking voltages, to respond fast (e.g., within 2 ns) and to handle large magnitudes of stress current, to safely prevent system damage during stress conditions as defined by, e.g. the IEC 61000-4-2 or ISO 10605 standards. In addition, it may be desirable, in some applications, to have the protection device 156 having variable and/or asymmetric trigger voltages and variable and/or asymmetric holding voltages.

Figure 1C:
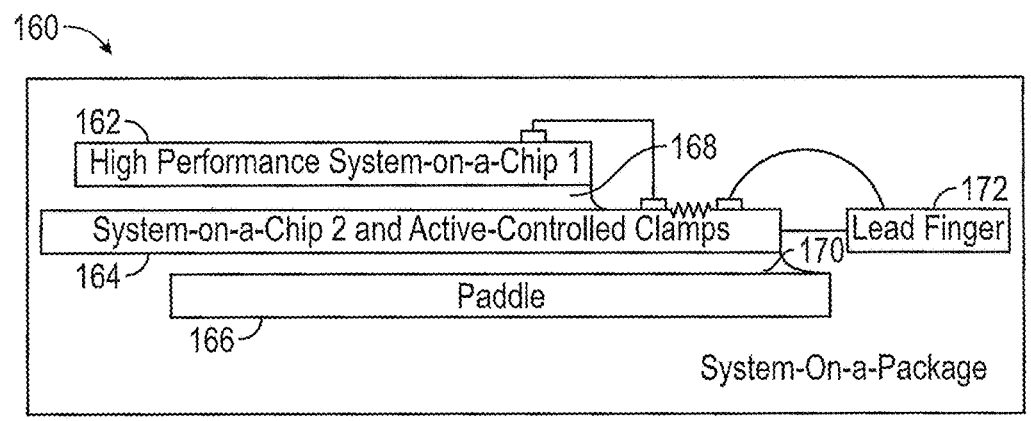
FIG. 1C is a schematic side view of system in package (SIP) arranged in a stacked configuration and having integrated therein a bidirectional protection device, according to embodiments.

FIG. 1C is a schematic side view of system in package (SIP) 160 arranged in a stacked configuration and having integrated therein a bidirectional protection device, according to embodiments. The SIP 160 includes a plurality of systems-on-chips (SOCs), including a first SOC 162 and a second SOC 164 that are communicatively coupled to each other and physically attached in a stacked configuration using a glue layer 168. The first SOC 162 can be, e.g., a high performance signal processing, sensing and communication SOC implemented in a first semiconductor process technology, and the second SOC 164 that can include a bidirectional protection device implemented in a second semiconductor process technology, according to embodiments. The second SOC 164 is configured to be coupled to an external contact lead 172 through the integrated bidirectional protection device, thereby providing protection for the SIP 160 against transient electrical events.

Figure 1D:
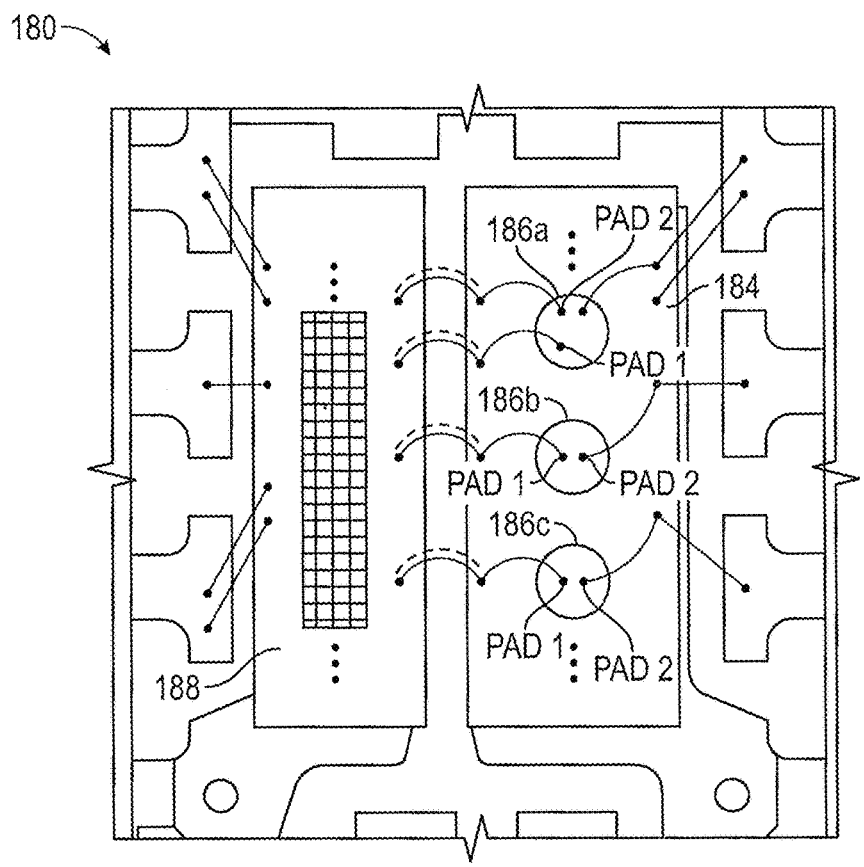
FIG. 1D is a schematic plan view of a system in package (SIP) arranged in a laterally adjacent configuration having integrated therein a bidirectional protection device, according to embodiments.

FIG. 1D is a schematic plan view of a system in package (SIP) 180 arranged in a laterally adjacent configuration having integrated therein a bidirectional protection device, according to embodiments. The SIP 180 includes a plurality of SOCs, including a first system-on-a-chip (SOC) 184 and a second system-on-a-chip (SOC) 188 that are communicatively coupled and laterally adjacent to each other. The second SOC 188 can be, e.g., a high-performance signal-processor, isolator, sensing or communications SOC implemented in a plurality of specialized semiconductor process technologies. The first SOC 184 can include a plurality of bidirectional protection devices 186a-186c implemented in a different semiconductor process technology, according to embodiments. The second SOC 184 is configured to be coupled to a plurality external contact leads through bidirectional protection devices that are integrated therein, thereby providing protection for the SIP 180 against transient electrical events. A plurality of connections between the different dies incorporated within the SOC or between the dies and the package pins can be formed as appropriate for the application within the scope of the disclosed technology.

Figure 2A:
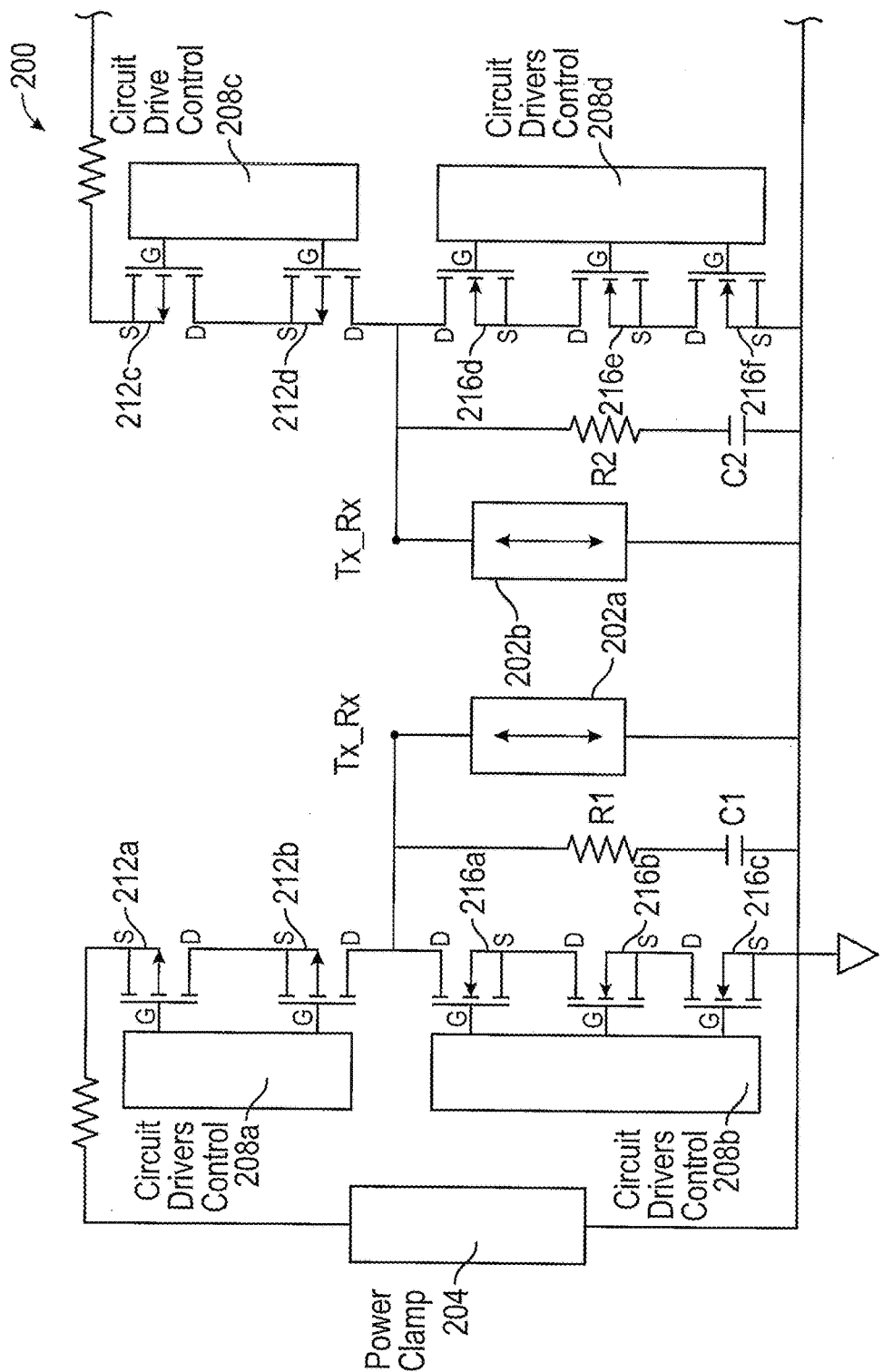
FIGS. 2A and 2B are schematic circuit diagrams of example transceiver interfaces having a bidirectional protection device, according to embodiments.
Figure 2B:
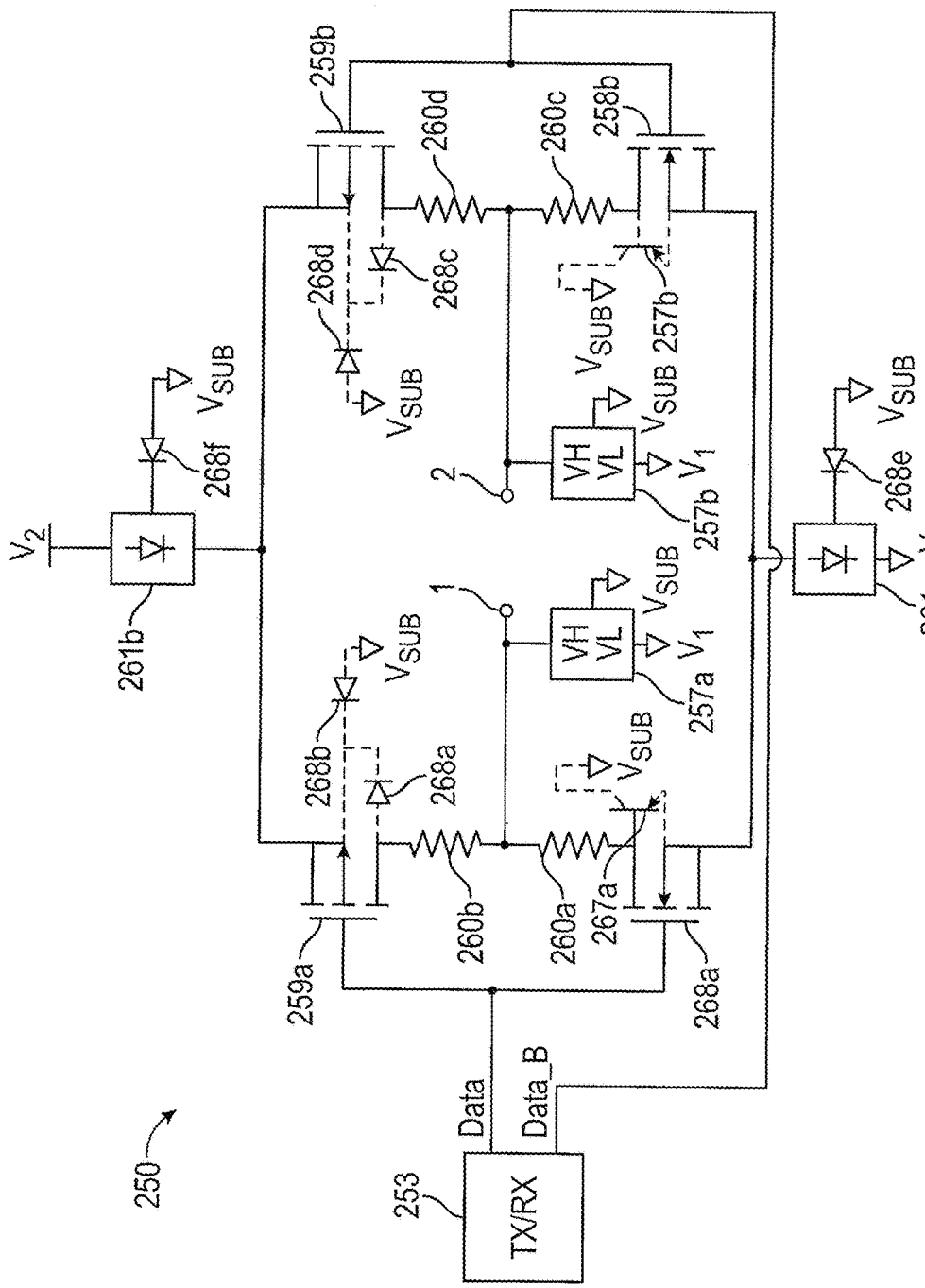

FIGS. 2A and 2B illustrate circuit diagrams of transceiver interfaces 200 and 250, respectively, which can be implemented with the bidirectional protection devices, according to embodiments. The transceiver interfaces 200, 250 can be, for example, an interface IC, such as a half or full duplex communication transceiver IC in which the terminals or pins are directly exposed to a user, for instance, connected to car cables or an industrial machinery hardness, in a normal operational environment. The transceiver interfaces 200, 250 can be used to communicate data over the interface, such as by using low voltage differential signaling.

Referring to FIG. 2A, the transceiver interface 200 includes first and second terminals (left and right Tx_Rx's), a power clamp 204, first through fourth circuit driver control units 208a-208d, a first clamp device 202a, a second clamp device 202b, first though sixth n-type metal oxide semiconductor (NMOS) transistors 216a-216f, first thorough fourth p-type metal oxide semiconductor (PMOS) transistors 212a-212d, a first resistor R1, and a second resistor R2.

The NMOS transistors 216a-216f and PMOS transistors 212a-212d can be used for electrically transmitting signals over the terminals Tx_Rx. For example, the circuit driver control units 208a-208d can be used to control the gate voltages of the NMOS transistors 216a-216f and PMOS transistors 212a, 212d to control a differential voltage between the terminals Tx_Rx. The voltage can have positive or negative polarity.

The first clamp device 202a includes a first terminal electrically connected to the first terminal Tx_Rx (left) and a second terminal electrically connected to a power low voltage, a substrate voltage $V_{SUB}$. Similarly, the second clamp device 202b includes a first terminal electrically connected to the second terminal Tx-Rx (right) and a second terminal electrically connected to a substrate voltage $V_{SUB}$. The first and second clamp devices 202a, 202b can be used to protect the transceiver interface 200 from ESD and/or EMI events. The clamp devices 202a, 202b can protect components of the transceiver interface 200 including, for example, parasitic substrate devices associated with the components.

FIG. 2B shows a circuit diagram of another transceiver interface 250, which can include one or more dual-polarity overvoltage clamp devices described herein, according to embodiments. The transceiver interface 250 includes a first pin 1, a second pin 2, a transceiver circuit (Tx/Rx) 253, a first clamp device 257a, a second clamp device 257b, a first n-type metal oxide semiconductor (NMOS) transistor 258a, a second NMOS transistor 258b, a p-type metal oxide semiconductor (PMOS) transistor 259a, a second PMOS transistor 259b, a first resistor 260a, a second resistor 260b, a third resistor 260c, a fourth resistor 260d, a first diode structure 261a, and a second diode structure 261b.

The NMOS transistors 258a, 258b and PMOS transistors 259a, 259b can be used for electrically transmitting signals over the first and second pins 1, 2. For example, the transceiver circuit 253 can be used to control the gate voltages of the NMOS transistors 258a, 258b and PMOS transistors 259a, 259b, e.g., to control a differential voltage between the first and second pins 1, 2. The voltage can have positive or negative polarity.

Still referring to FIG. 2B, the transceiver interface 250 can receive power from a power high supply voltage $V_2$ and a power low supply voltage $V_1$. Certain components of the transceiver interface 250, such as the NMOS transistors 258a, 258b, PMOS transistors 259a, 259b, diode structures 261a, 261b, and clamp devices 257a, 257b can be fabricated in a substrate that is biased using a substrate voltage $V_{SUB}$.

Various parasitic substrate devices can be present in the transceiver interface 250. The parasitic substrate devices can include terminals electrically connected to the substrate voltage $V_{SUB}$. Absent protection, the parasitic substrate devices may be damaged during ESD and/or EMI conditions.

In the illustrated configuration, the NMOS transistors 258a, 258b include parasitic substrate bipolar transistors 267a, 267b, respectively. Additionally, the PMOS transistors 259a, 259b include parasitic substrate diodes 268a-268d. Furthermore, the diode structures 261a, 261b include parasitic substrate diodes 268e, 268f, respectively. Although a certain parasitic substrate devices are shown in FIG. 2B, other configurations of parasitic substrate devices are possible.

The first clamp device 257a includes a first terminal VH electrically connected to the first pin 1, a second terminal VL electrically connected to the power low voltage $V_1$, and a substrate terminal electrically connected to the substrate voltage $V_{SUB}$. Additionally, the second clamp device 257b includes a first terminal VH electrically connected to the second pin 2, a second terminal VL electrically connected to the power low voltage $V_1$, and a substrate terminal electrically connected to the substrate voltage $V_{SUB}$. The first and second clamp devices 257a, 257b can be used to protect the transceiver interface 250 from ESD and/or EMI events. The clamp devices 257a, 257b can protect components of the transceiver interface 250 including, for example, parasitic substrate devices associated with the components.

The transceiver interfaces 200 and 250 of FIGS. 2A and 2B, respectively, illustrate examples transceiver interfaces that can be implemented with bidirectional protection devices described herein. However, the transceiver interfaces can be implemented in other ways to meet communication protocol constraints.

Additionally, although the clamp devices have been illustrated in the context of transceiver interfaces, the clamp devices described herein can be used in a wide range of ICs and other electronics, including, for example, industrial control systems, interface systems, power management systems, microelectromechanical system (MEMS) sensor systems, automotive systems, wireless infrastructure systems, and/or digital signal processing (DSP) systems. Additionally, although the transceiver interface 20 has been illustrated as including two signal pins and two clamp devices, more or fewer clamp devices and pins can be included to meet system specifications. Furthermore, the clamp devices can be connected in other ways. For example, the terminals of the clamp devices can be connected in other ways, such as to other nodes and/or voltages.

Some protection devices include one or more semiconductor-controlled rectifiers (SCRs), which can provide asymmetric or symmetric blocking protection against electrical overstress (EOS) events having relatively high voltage and/or current density. Some SCRs, however, have slow response time, which can compromise the capability of protecting an electronic systems that may be subject to low input resistance constraints (e.g. <20Ω). The protection devices often need to meet competing needs of providing protection from EOS pulses having high voltage while providing a holding voltage that is high enough to prevent latch-up, while being configured to respond fast to transient stresses. However, meeting the competing needs simultaneously can be difficult, as an improvement in one parameter often results in a degradation of other parameters. For instance, a relatively long spacing between the two terminals of an SCR can increase the blocking and holding voltage. However, such an approach can result in a lower turn-on speed and high overshoot voltage in response to EOS events. Some options proposed for addressing overshoot issues include the use of external trigger circuits to speed up the turning-on process. However, employing an external trigger circuit leads to a larger footprint, higher cost, and is not always suitable for interface circuits with high dual-polarity voltage swing signal. Thus, in the following, various embodiments of protection devices that are provided that are compact and have fast-response times.

Figure 3A:
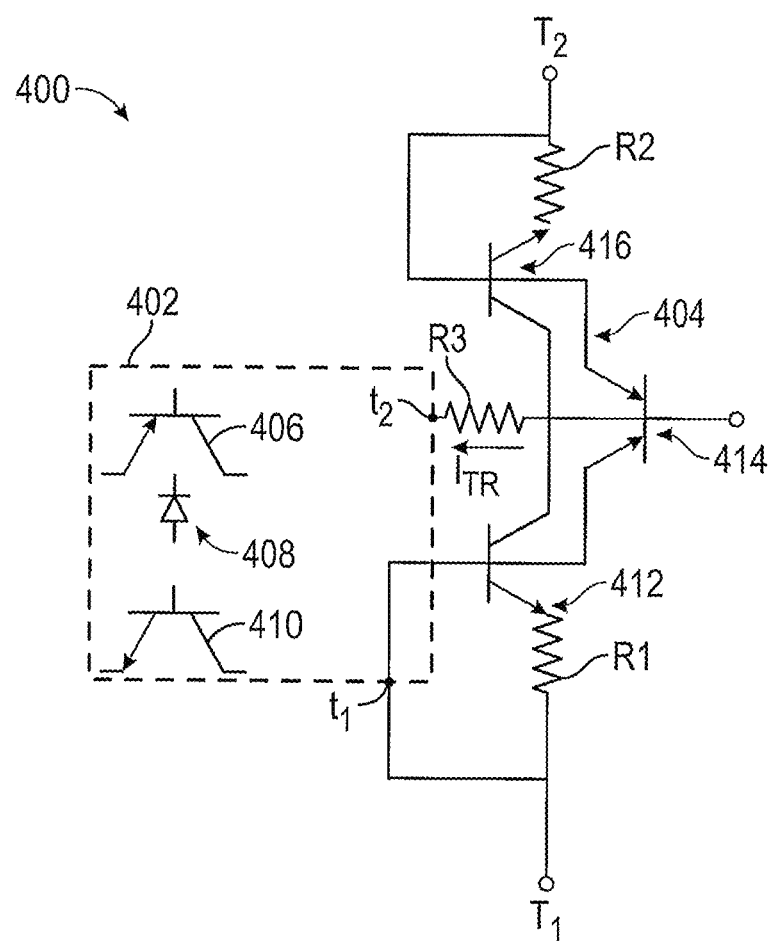
FIG. 3A is a schematic circuit diagram of a bidirectional protection device having a triggering device and a gain-controlled bidirectional semiconductor-controlled rectifier (SCR), according to embodiments.

FIG. 3A is a schematic circuit diagram of a bidirectional protection device 400 having a triggering device and a gain-controlled bidirectional semiconductor-controlled rectifier (SCR), according to embodiments. Referring to FIG. 3A, the bidirectional protection devices 400 includes a first terminal (T1) and a second terminal (T2) configured to receive a transient electrical signal therebetween, e.g., a transient positive or negative voltage signal that may exceeds a triggering voltage of the bidirectional protection device 400. For example, one of the T1 or T2 can be a signal pin or pad of an IC, and the other of the T1 or T2 can be a power low pin or pad, such as a pad associated with the power low voltage supply such as $V_{SS}$ or ground.

The bidirectional protection device 400 of FIG. 3A includes a triggering device 402 configured to provide a first current shunt path and a bidirectional semiconductor-controlled rectifier (SCR) 404 configured to provide a second current shunt path. The triggering device 402 and the bidirectional SCR 404 are electrically coupled to each other and configured such that the triggering device 402, upon thresholding or triggering, discharges or receives a first current, or discharges a charge carrier (i.e., electrons or holes), which at least in part causes the bidirectional SCR 404 to trigger to discharge a second current.

Figure 4B:
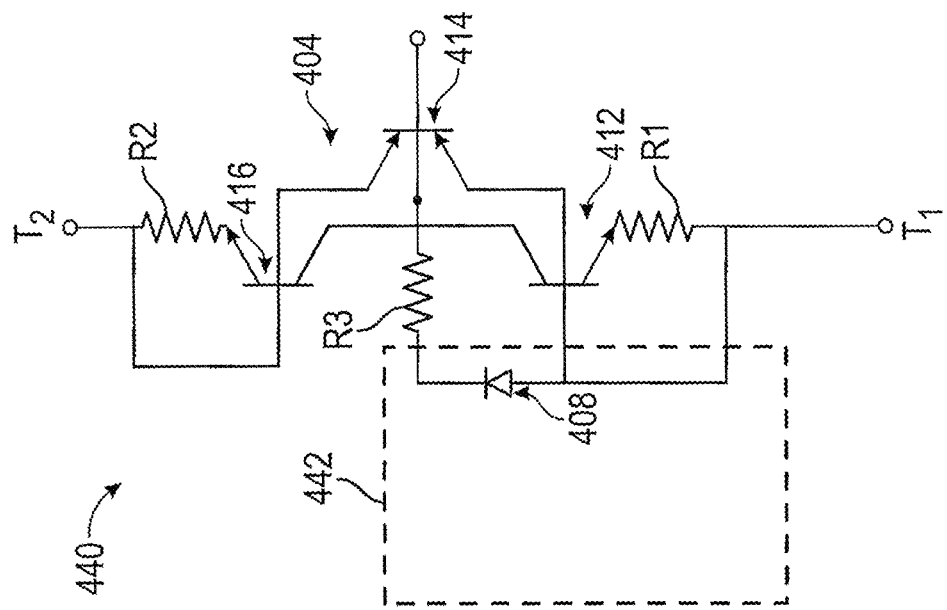
FIG. 4B is a schematic circuit diagram of a bidirectional protection device having an avalanche diode-based triggering device and a gain-controlled bidirectional SCR, according to embodiments.
Figure 4A:
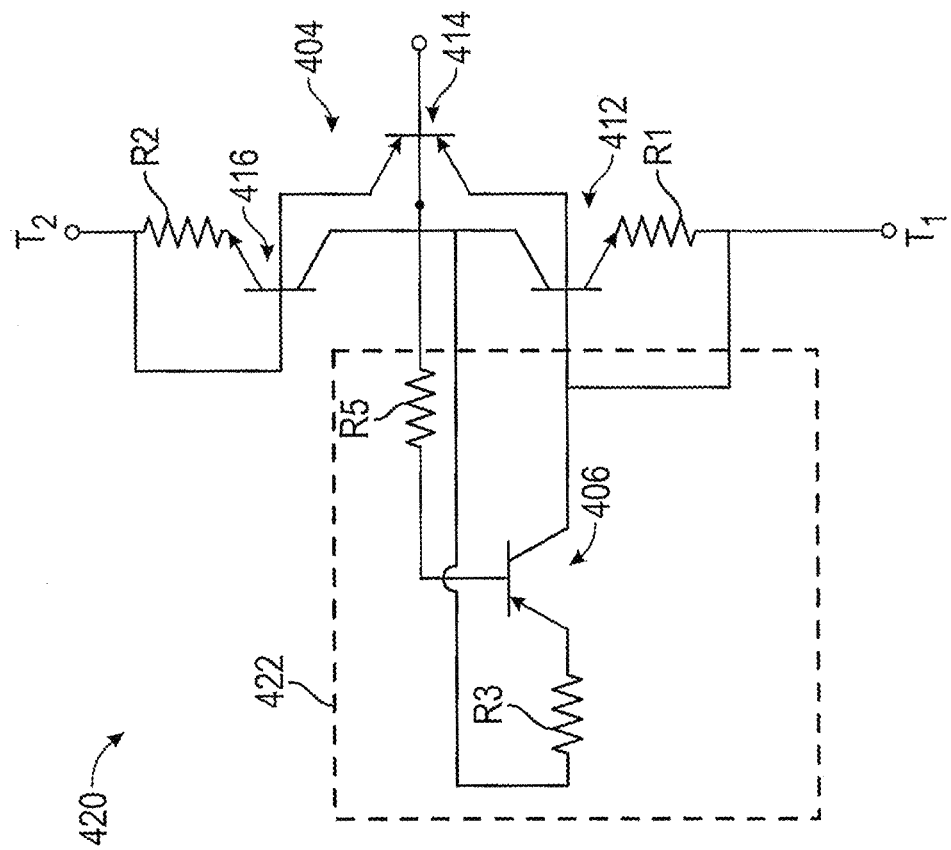
FIG. 4A is schematic circuit diagram of a bidirectional protection device having a PNP bipolar junction transistor-based triggering device and a gain-controlled bidirectional SCR, according to embodiments.
Figure 4C:
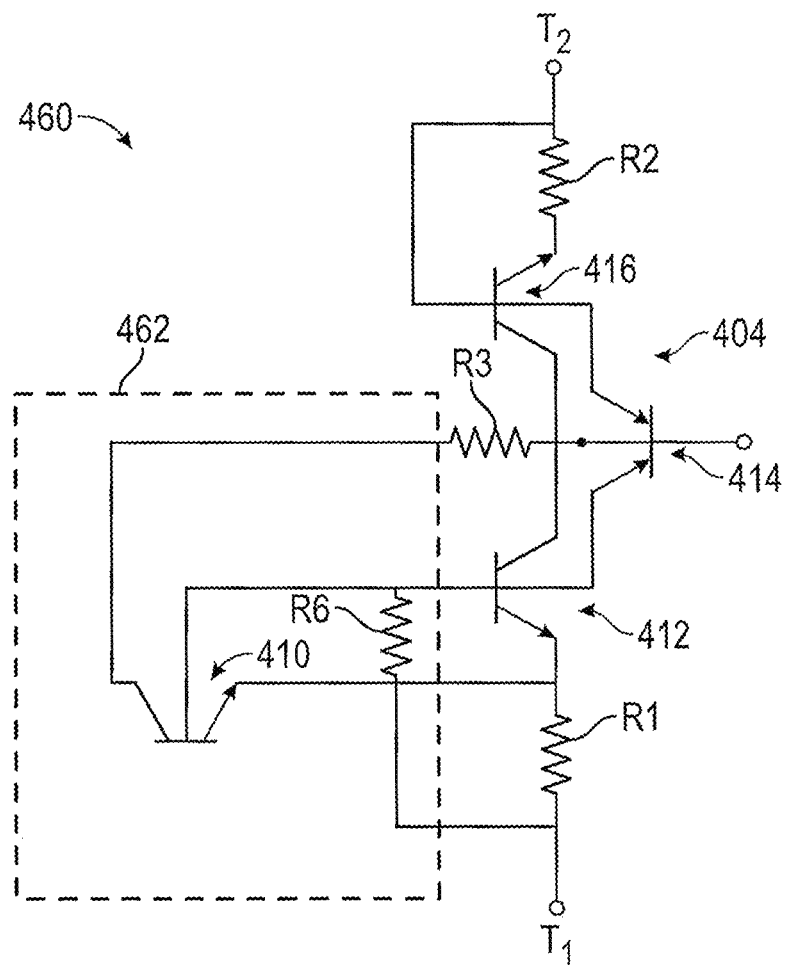
FIG. 4C is schematic circuit diagram of a bidirectional protection device having an NPN bipolar junction transistor-based triggering device and a gain-controlled bidirectional SCR, according to embodiments.

The triggering device 402 of the bidirectional protection device 400 includes one or more of an NPN bipolar junction transistor (BJT) 410, a PNP bipolar junction transistor (BJT) 406 or an avalanche PN diode 408. Examples of the triggering device 402 having various devices are described more in detail infra. FIG. 4A illustrates an embodiment having an NPN BJT, FIG. 4B illustrates an example embodiment having an avalanche PN diode, and FIG. 4C illustrates an embodiment having a PNP BJT. The triggering device 402 has a first device terminal t1 and a second device terminal t2, each of which may be one of transistor terminals or diode terminals of the triggering device 402. The t1 of the triggering device 402 is electrically connected, e.g., directly connected, to the T1 of the bipolar protection device 400, while t2 of the triggering device 402 is electrically connected, e.g., connected through a third resistor (R3), to the bidirectional SCR 404 and configured to supply current thereto or receive current therefrom (i.e., to supply a charge carrier). In various embodiments, the t2 of the triggering device may be connected to a central region of the bidirectional SCR 404, e.g., the central n-type region of an NPNPN bidirectional SCR.

It will be appreciated that, while not shown in FIG. 3A, an additional triggering device may be present, which has a third terminal (t3, not shown), which is electrically connected, e.g., directly connected, to the T2 of the bipolar protection device 400 and commonly connected to the bidirectional SCR 404 through the third resistor (R3). An embodiment having the additional triggering device is described in more detail infra with respect to FIG. 5.

The bidirectional SCR 404 includes a first NPN bipolar transistor (BJT) 412, a PNP bidirectional bipolar transistor (BJT) 414, and a second NPN bipolar transistor (BJT) 416. The emitter of the first NPN BJT 412 is electrically connected to T1 through a first resistor R1 and the base of the first NPN BJT 412 is commonly electrically connected to T1, such that the collector and the base of the first NPN BJT 416 are electrically connected to each other through the R1. The base of the first NPN BJT 412 is electrically connected to a collector/emitter (C/E) of the PNP bidirectional BJT 414, and the collector of the first NPN BJT 412 is electrically connected to the base of the PNP bidirectional BJT 414. Analogously, the emitter of the second NPN BJT 416 is electrically connected to T2 through a second resistor R2 and the base of the second NPN BJT 416 is commonly electrically connected to T2, such that the collector and the base of the second NPN BJT 416 are electrically connected to each other through the R2. The base of the second NPN BJT 416 is electrically connected to an emitter/collector (E/C) of the PNP bidirectional BJT 414, and the collector of the second NPN BJT 416 is electrically connected to the base of the PNP bidirectional BJT 414.

Referring now to electrical connections between the triggering device 402 and the bidirectional SCR 404 illustrated in FIG. 3A, the first device terminal t1 of the triggering device 402 is electrically connected to the emitter of the first NPN BJT 412 through the first resistor R1. That is, the emitter of the first NPN BJT 412 and the first device terminal t1 of the triggering device 402 are commonly electrically connected to the T1 for receiving a transient electrical signal. In addition, the second device terminal t2 of the triggering device 402 is electrically connected to the base of the PNP bidirectional BJT 414 through the third resistor R3, such that once activated, the triggering device 402 is configured to provide to or receive from the bidirectional SCR 404 triggering current $I_{TR}$ to at least in part cause the activation of the bidirectional SCR 404, which is discussed more in detail below. In the illustrated embodiment, the triggering device 402 is configured to supply electrons to the base region of the PNP bidirectional BJT 414. In the following, operational principles of the bidirectional SCR 404 are described, followed by operational principles of the triggering device 402 and the electrical coupling of the triggering device 402 to the bidirectional SCR 404.

In one illustrative aspect, the bidirectional SCR 404 can be described as including the PNP bidirectional BJT 414 and the first NPN BJT 412 that are configured as a first NPNP SCR to be activated in response to a positive voltage received at the T2 relative to the T1 (or a negative voltage received at the T1 relative to the T2). The bidirectional SCR 404 can be described as additionally including the PNP bidirectional BJT 414 and the second NPN BJT 416 that are configured as a second NPNP SCR to be activated in response to a positive voltage received at the T1 relative to the T2 (or a negative voltage received at the T2 relative to the T1). In this way, the bidirectional SCR 404 can be triggered in either voltage polarities between the T1 and the T2.

The first NPNP SCR comprises: a first N-region comprising the emitter of the first NPN BJT 412; a first P-region comprising the collector/emitter (C/E) of the PNP bidirectional BJT 414 that can be common with or connected to the base of the first NPN BJT 412; a second N-region comprising the base of the PNP bidirectional BJT 414 that can be common with or connected to the collector of the first NPN BJT 412; and a second P-region comprising the emitter/collector (E/C) of the PNP bidirectional BJT 414. As described herein, the first N-region, the second N-region, and the second P-region may sometimes referred to as a "cathode," a "gate," and an "anode," respectively, of the first NPNP SCR.

Similarly, the second NPNP SCR comprises: a first N-region comprising the emitter of the second NPN BJT 416; a first P-region comprising the emitter/collector (E/C) of the PNP bidirectional BJT 414 that can be common with or connected to the base of the second NPN BJT 416; a second N-region comprising the base of the PNP bidirectional BJT 414 that can be common with or connected to the collector the second NPN BJT 416; and a second P-region comprising the collector/emitter (C/E) of the bidirectional PNP BJT 414. As described herein, the first N-region, the second N-region, and the second P-region may sometimes be referred to as a "cathode," a "gate," and an "anode," respectively, of the second NPNP SCR.

Without being bound to any theory, it will be appreciated that each of the first and second NPNP SCRs can be activated in different ways. One mode of activation is associated with a voltage applied between the cathode and the anode of the first or second NPNP SCR. This mode is sometimes referred to as voltage triggering, which occurs when a forward voltage (i.e., a positive voltage) exceeding a threshold value is placed between an anode relative to the cathode of an NPNP SCR. Under a forward voltage below a threshold voltage of the first NPNP SCR, the first NP junction between the first N-type region and first P-type region and the second NP junction between the second N-type region and the second P-type region are forward biased, while the middle PN junction between the first P-type region and the second N-type region is initially reverse biased. Initially, little current flows across the PNPN SCR because little carriers cross the middle PN junction. However, at or above a forward voltage exceeding the first threshold value of the first NPNP SCR, the first NPNP SCR begins to conduct in part due to avalanche multiplication of carriers in the middle PN junction. Once the breakdown begins, an increase in majority carriers in the first P-type region and the second N-type region drives the middle PN junction to be forward biased, resulting in a low impedance state in which all junctions of the first NPNP SCR become forward biased. An analogous condition may trigger the second NPNP SCR into a low impedance state when a when a forward voltage exceeding a threshold value is placed between an anode relative to the cathode of the second NPNP SCR.

Under voltage triggering mode, when a transient electrical event induces a negative voltage on the T1 relative to the T2, whose absolute value exceeds a first triggering voltage ($V_{TR1}$), or a negative voltage on the T2 relative to the T1, whose absolute value exceeds a second triggering voltage ($V_{TR2}$), the first and second NPNP SCRs may both be thresholded such that the bidirectional SCR 204 is activated. As an illustrative example sequence of events with respect to the bidirectional SCR 404 of FIG. 3A, in response to a negative voltage on the T1 relative to the T2 exceeding $V_{TR1}$, the first NPN BJT 412 may begin to conduct, resulting in its collector potential being pulled down, which in turn pulls down the base potential of the PNP bidirectional BJT 414. This in turn causes the junction breakdown of the middle NP junction, causing the PNP bidirectional BJT 414 to conduct. When the PNP bidirectional BJT 414 starts to conduct, its collector potential is pulled up, which in turn pulls up the base potential of the second NPN BJT 416. Alternatively, in response to a negative voltage on the T2 relative to the T1 exceeding $V_{TR2}$, an analogous sequence of events can lead to triggering of the bipolar SCR 404 into a conductive state. Once the bidirectional SCR 404 is triggered in this way, it enters into a low impedance mode, in which a low impedance can be maintained by a feedback loop formed between one of the first and second NPN BJTs 412, 416 and the PNP bidirectional BJT 414 as discussed above, even if the absolute voltage across the T1 and T2 subsequently falls below $V_{TR1}$ and $V_{TR2}$.

In addition to the voltage triggering mode of activation discussed above, the activation of the bipolar SCR 404 can be caused by another mode of activation when majority carriers are supplied to the gate of the first and second NPNP SCRs described above, which is the base of the PNP bidirectional BJT 414 in FIG. 3A. This second mode, sometimes referred to as gate-triggering, occurs when, in combination to the forward voltage across the first or second NPNP SCR as described above, charge carriers are supplied (e.g., electrons) to the gate (e.g., the base of the PNP bidirectional BJT 414 of the first or second NPNP SCR). The charge carriers supplied to the gate of the NPNP SCRs accelerates the low impedance state by supplying the majority carriers to the gate region such that the forward biasing of the middle PN junction may be accelerated, thus accelerating the low impedance state. In the bidirectional SCR 404 of FIG. 3A, the triggering device 402 is configured to supply the charge carriers to the gate of the first and second NPNP SCRs.

In operation, the triggering device 402 may be activated, among other factors, when the voltage across t1 and t2 exceeds the threshold or triggering voltage of the triggering device 402. Upon being activated, the triggering device 402 causes the generation of the triggering current $I_{TR}$, which at least in part causes the bidirectional SCR 404 to be activated. Example embodiments of the triggering device 402 are described infra with respect to FIGS. 4A-4C.

Figure 3B:
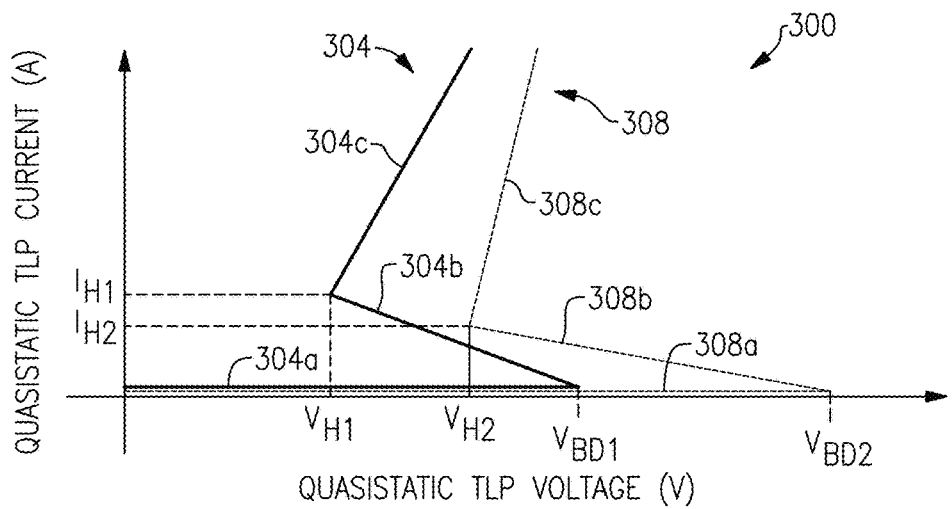
FIG. 3B illustrates schematic quasistatic current-voltage curves of a triggering device and a gain-controlled bidirectional SCR, according to embodiments.

FIG. 3B is a schematic graph 300 illustrating current-voltage (IV) curves of a triggering device and a gain-controlled bidirectional SCR that would be obtained individually if the triggering device was not connected to cause the triggering of the bidirectional SCR. In particular, the graph 304 schematically illustrates a quasistatic response of the bidirectional SCR 404 to a voltage signal received between the T1 and T2, and the graph 308 schematically illustrates a quasistatic response of the triggering device 402 to a voltage signal received between the t1 and t2. The x-axis and the y-axis represent the quasistatic voltage and the corresponding current, respectively. The IV curves 304 and 308 have respective blocking regions ("OFF" regions) 304a and 308a, respectively characterized by very high impedances, between the origin and respective breakdown voltages $V_{BD1}$ and $V_{BD2}$. As used in the context of DC or quasistatic responses illustrated in FIG. 3B, $V_{BD1}$ may correspond to a DC or quasistatic breakdown voltage of the SCR and $V_{BD2}$ may correspond to a DC or quasistatic breakdown voltage of a BJT or an avalanche diode of the triggering device. When the voltage across T1 and T2 reaches $V_{BD1}$ and the voltage across t1 and t2 reaches $V_{BD2}$, dV/dI becomes zero and switching of the respective bidirectional SCR 404 and the triggering device 402 occurs. The blocking regions 304a and 308a are followed by respective negative resistance regions 304b and 308b (also referred to as "snap-back region") between $V_{BD1}$ and a first hold voltage $V_{H1}$ and between $V_{BD2}$ and a second hold voltage $V_{H2}$, respectively, followed by respective positive resistance regions ("ON" regions) 304c and 308c. At the hold voltages $V_{H1}$ and $V_{H2}$, the corresponding holding current values are $I_{H1}$ and $I_{H2}$, respectively, which can represent minimum level of currents that can maintain the "ON" states of the respective devices. According to embodiments, the bidirectional SCR 404 and the triggering device 402 are configured such that, under quasistatic conditions or in response to a voltage signal having a relatively long duration (e.g., longer than about 100 ns or longer than about 1 μs), the $V_{BD1}$ of the bidirectional SCR 404 is lower than the $V_{BD2}$ of the triggering device 402. For example, the bidirectional SCR 404 may be configured to have, under a quasistatic condition, a $V_{BD1}$ between about 5V and about 25V, or between about 10V and about 20V, for instance about 15V, while the triggering device 402 may be configured to have a $V_{BD2}$ between about 10V and about 40V, between about 15V and about 35V, or between about 20V and about 30V, for instance about 25V.

Figure 3C:
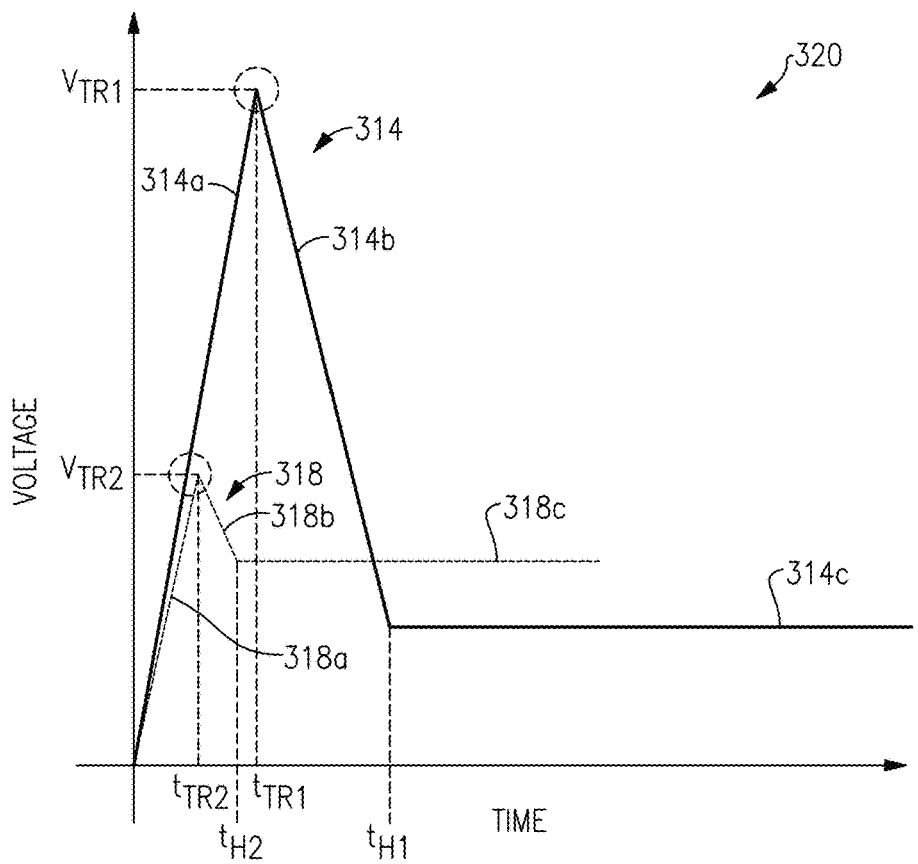
FIG. 3C illustrate schematic voltage-time curves of the triggering device and the gain-controlled bidirectional SCR corresponding to a triggering device and a gain-controlled bidirectional SCR individually, according to embodiments.

FIG. 3C is a schematic graph 320 illustrating transient voltage-time (V-t) curves of a triggering device and a gain-controlled bidirectional semiconductor-controlled rectifier similar to those described with respect to FIG. 3A, individually (i.e., without being connected to each other), for illustrative purposes. In particular, the graph 314 schematically illustrates a response of the bidirectional SCR 404 to a relatively short-pulsed (e.g., shorter than about 1 μm or shorter than about 100 ns) voltage signal received between the T1 and T2, and the graph 318 schematically illustrates a response of the triggering device 402 to a similar relatively short-pulsed voltage signal received between the t1 and t2. For example, the x-axis and the y-axis of the graph 320 represent time and the transmission line pulsed (TLP) voltage, respectively. The V-t curves 314 and 318 have respective blocking regions ("OFF" regions) 314a, 318a characterized by very high impedances, between the origin and respective breakdown times $t_{TR1}$ and $t_{TR2}$ corresponding to the bidirectional SCR 404 and the triggering device 402. At $t_{TR1}$ and $t_{TR2}$, dV/dt reaches zero and the switching of the triggering device 402 occurs, followed by the switching of the bidirectional SCR 404 occurs. The blocking regions 314a and 318a are followed by respective negative resistance regions 314b and 318b between the $t_{BD1}$ and first hold time $t_{H1}$ and between $t_{BD2}$ and second hold time $t_{H2}$, respectively, followed by respective positive resistance regions ("ON" regions) 314c and 318c. At the hold times $t_{H1}$ and $t_{H2}$, the corresponding current values are $I_{H1}$ and $I_{H2}$. Unlike responses of the respective devices to quasistatic voltage signals as described above with respect to FIG. 3B, the bidirectional SCR 404 and the triggering device 402 are configured such that, in response to a relatively short duration, e.g., in response to a transmission line pulses received between T1 and T2 and between t1 and t2, a triggering or turn on voltage $V_{TR1}$ of the bidirectional SCR 404 is substantially higher than the a triggering or turn on voltage $V_{TR2}$ of the triggering device 402. For example, the bidirectional SCR 404 may be configured to have, under a TLP condition having a very short transient voltage duration, having e.g., a rise time between about 100 ps and about 10 ns, for instance 600 ps, and/or having a pulse width between about 5 ns and about 500 ns, for instance 100 ns, a $V_{TR1}$ between about 50V and about 150V, between about 75V and about 125V, for instance about 100V, while the triggering device 402 may be configured to have $V_{TR2}$ that is substantially lower at about 10V and about 50V, between about 20V and about 40V, for instance about 30V.

As illustrated by FIGS. 3B and 3C, the voltage at which each of the bidirectional SCR 404 and the triggering device 402 can be activated to low impedance states can depend on the duration, e.g. temporal width, of the activating signal received by the respective device. Conversely, the speed at which each of the bidirectional SCR 404 and the triggering device 402 can be activated to low impedance states can depend on the voltage of the activating signal received by the respective device. Without being bound to any theory, such reduction is sometimes referred to as the dV/dt effect, the magnitude of whose effect can depend on, among other factors, the capacitances of reverse biased junctions. Based on this effect, inventors have recognized that, as illustrated in FIG. 3C, the bidirectional protection device 400 can be configured such that V-t curves 318 and 314 associated with activation of the bidirectional SCR 404 and the triggering device 402 can be customized, e.g., to overlap or to be separated. In the illustrated example, the peaks of the V-t curves of the bidirectional SCR 404 and the triggering device 402 can be tailored to be within a certain time window, for example, to prevent physical damage to the triggering device 402, which may not be configured to handle as much current as the bidirectional SCR 404. For example, in various embodiments, for the bidirectional SCR 404 and the triggering device 402 having $V_{BD1}$ and $V_{BD2}$ values described above with respect to FIG. 3B, for transient voltage signals having, e.g., a rise time between about 100 ps and about 10 ns, for instance 600 ps, and/or having a pulse width between about 5 ns and about 500 ns, for instance 100 ns, the difference ($t_{BD1}$–$t_{BD2}$) between the peaks of the V-t curves 314 and 318 can be, for example between about 200 ps and about 10 ns, between about 150 ps and about 5.5 ns, for instance about 3 ns.

Still referring to FIGS. 3B and 3C, it will be appreciated that, under certain conditions, a transient voltage signal may activate the triggering device but not activate the bidirectional SCR, e.g., when the voltage of the transient voltage signal is between $V_{BD1}/V_{TR1}$ and $V_{BD2}/V_{TR2}$ and/or when the duration of the transient voltage signal is between $t_{BD1}$ and $t_{BD2}$.

Referring back to FIG. 3C, for certain applications, it may be desirable to have a relatively high holding voltage ($V_H$) of the bidirectional SCR to prevent damage to a passive component, such as a resistor that may be connected in series with the bidirectional protection device. Referring back to FIG. 3A, in various embodiments described herein, the $V_H$ may be increased by decreasing the emitter injection efficiency and current gain of the first and/or second NPN BJTs 412, 416, which may in turn be achieved by connecting the emitter region of the first NPN BJT 412 to a first resistor R1 and connecting the emitter region of the second NPN BJT 412 to a second resistor R2. In various embodiments, by tailoring each of the R1 and R2 to have a resistance value in a range between about 0.001 Ohms and about 20 Ohms, between about 0.5 Ohms and about 2 Ohms, or between about 2 Ohms and about 10 Ohms, the $V_H$ of the bidirectional SCR 404 can be correspondingly tailored to have a value in the range between about 3 V and about 15 V, between about 4V and about 5V, or between about 5V and about 8V, respectively.

FIGS. 4A-4C are schematic circuit diagrams of bidirectional protection devices with different triggering devices, according to various embodiments. Similar to the bidirectional protection device 400 described above with respect to FIG. 3A, each of the embodiments illustrated in FIGS. 4A-4C includes a bidirectional SCR 404 and a triggering device, wherein the triggering device and the bidirectional SCR 404 are electrically coupled to each other such that the triggering device, upon being activated, causes carriers, e.g., electrons, to flow into or out of the bidirectional SCR 404, which at least in part causes the bidirectional SCR 404 to be activated.

FIG. 4A illustrates a bidirectional protection device 420 in which the triggering device 422 includes a PNP triggering BJT 406, according to embodiments. The PNP triggering BJT 406 includes a collector electrically connected to the base of the first NPN BJT 412 and to the T1, and further includes a base electrically connected to the base of the PNP bidirectional BJT 414. of the bidirectional SCR 404, through a fifth resistor R5. The PNP triggering BJT 406 further includes an emitter connected to the collectors of the first and second NPN BJTs 412, 416 of the PNP bidirectional SCR 414, through a third resistor R3. When the bidirectional protection device 420 receives a negative transient electrical signal at the T1 relative to the T2, the PNP triggering BJT 406 is activated, thereby supplying electrons to the bidirectional SCR 404 through the base of the PNP bidirectional BJT 414, which in turn accelerates the activation of the bidirectional SCR 404 into a low impedance state, as discussed above in connection with FIG. 3A.

FIG. 4B illustrates a bidirectional protection device 440 in which the triggering device 442 includes an avalanche triggering diode 408, according to embodiments. The avalanche triggering diode 408 includes a p-type anode electrically connected to the base of the first NPN BJT 412 and to the T1. The avalanche triggering diode 408 further includes an n-type cathode electrically connected to the base of the PNP bidirectional BJT 414. of the bidirectional SCR 404, through a third resistor R3. When the bidirectional protection device 440 receives a negative transient electrical signal at the T1 relative to the T2, the avalanche triggering diode 408 is activated, thereby supplying electrons to the bidirectional SCR 404 through the base of the PNP bidirectional BJT 414, which in turn accelerates the activation of the bidirectional SCR 404 into a low impedance state, as discussed above in connection with FIG. 3A.

FIG. 4C illustrates a bidirectional protection device 460 in which the triggering device 462 includes an NPN triggering BJT 410, according to embodiments. The NPN triggering BJT 410 includes a base electrically connected to the base of the first NPN BJT 412 and to the T1 through a sixth resistor R6, and further includes an emitter electrically connected to the emitter of the first NPN BJT 412 and to the T1 through a first resistor R1. The NPN triggering BJT 406 further includes a collector connected to the base of the PNP bidirectional BJT 414. of the bidirectional SCR 404 through a third resistor R3. When the bidirectional protection device 460 receives a negative transient electrical signal at the T1 relative to the T2, the NPN triggering BJT 410 is activated, thereby supplying electrons to the bidirectional SCR 404 through the base of the PNP bidirectional BJT 414, which in turn accelerates the activation of the bidirectional SCR 404 into a low impedance state, as discussed above in connection with FIG. 3A.

Figure 5:
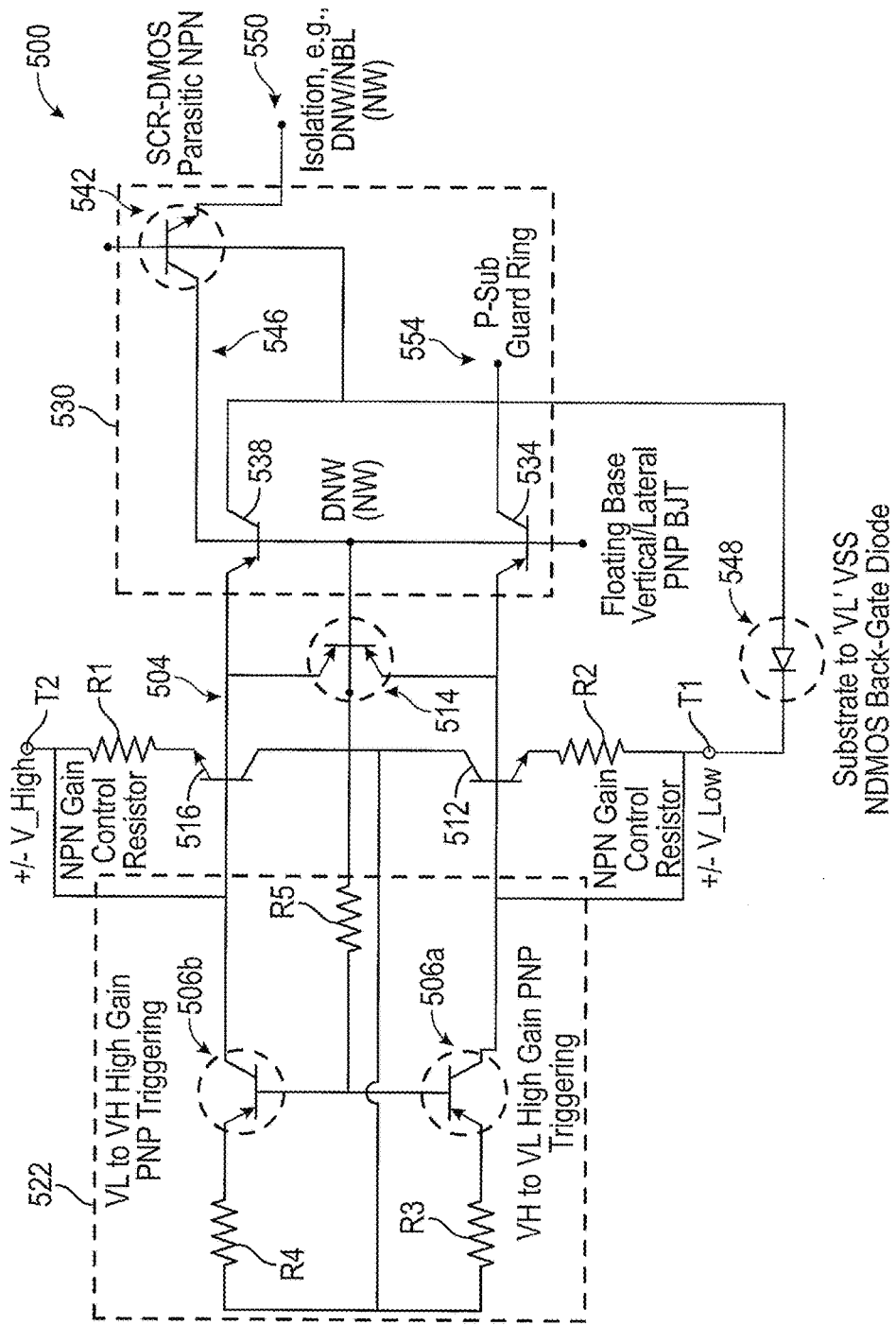
FIG. 5 is a schematic circuit diagram of a bidirectional protection device having a plurality of PNP bipolar junction transistor-based triggering devices and a gain-controlled bidirectional SCR, according to embodiments.

FIG. 5 is a schematic circuit diagrams illustrating a bidirectional protection device 500 having a plurality of PNP bipolar junction transistor-based triggering devices and a gain-controlled bidirectional triggering device, according to some embodiments. FIG. 5 shows, in addition to the protection device circuitry, surrounding circuitry that can be present in some embodiments.

The bidirectional protection device 500 includes a bidirectional SCR 504 that similar to the bidirectional SCR 404 of FIG. 4A, and includes a first NPN BJT 512, a PNP bidirectional BJT 514 and a second NPN BJT 516. The bidirectional SCR 504 is electrically connected to the R1, R2, T1 and T2 in an analogous manner to the bidirectional SCR 404 of FIG. 4A, and a detailed description of similar electrical connections is omitted.

Also similar to the bidirectional protection device 420 of FIG. 4A, the bidirectional protection device 500 includes a triggering device 522 includes a first PNP triggering BJT 506a, according to embodiments. The first PNP triggering BJT 506a is electrically connected to the first NPN BJT 512, T1, R5, the bidirectional BJT 514 and R3 in an analogous manner to the triggering device 422 of FIG. 4A, and a detailed description of similar electrical connections is omitted. In addition to the first PNP triggering BJT 506a, the bidirectional protection device 500 additionally includes a second PNP triggering BJT 506b. The second PNP triggering BJT 506b includes a collector electrically connected to the base of the second NPN BJT 516 and to the T2, and further includes a base electrically connected to the base of the PNP bidirectional BJT 514 of the bidirectional SCR 504 through the R5. The emitter of the second PNP triggering BJT 506b is electrically connected to the bidirectional SCR 514 through a fourth resistor R4.

In operation, when the bidirectional protection device 520 receives a negative transient electrical signal between the T1 and T2 what exceeds a certain value, the first PNP triggering BJT 506a may be activated and supply electrons to the bidirectional SCR 404 through the base of the bidirectional BJT 514, which at least partially causes the activation of the bidirectional SCR 504 into a low impedance state, as discussed above in connection with FIG. 3A. Analogously, when the bidirectional protection device 520 receives a positive transient electrical signal between the T1 and T2 that exceeds a certain value, the second PNP triggering BJT 506b may be activated and supply electrons to the bidirectional SCR 504 through the base of the PNP bidirectional BJT 514, which at least partially causes the activation of the bidirectional SCR 504 into a low impedance state. While in some embodiments, the first PNP BJT 506a, the second PNP BJT 506b and the bidirectional SCR 514 may be configured such that the absolute voltages sufficient to activate the bidirectional protection device 520 may be similar or the same in opposite polarities, in other embodiments they may be configured such that the absolute voltages sufficient to activate the bidirectional protection device 520 may be different in opposite polarities, depending on the application.

Now referring to the surrounding circuitry of the bidirectional protection device 500, a parasitic circuit 530 electrically connected to the bidirectional SCR 504 may be present. The parasitic circuit 530 includes a first parasitic PNP BJT 534 and a second parasitic PNP BJT 538, each having a base commonly connected to the base of the PNP bidirectional BJT 514. In addition, the first and second parasitic PNP BJTs 534 and 538 have emitters electrically connected to the C/E and E/C of the bidirectional BJT 514, respectively. The collector of the first parasitic PNP BJT can be connected to a substrate region 554, e.g., a guard-ring structure formed in the substrate. The bases of the first and second parasitic PNP BJTs 534 and 538 are commonly connected to a first NPN parasitic BJT 542, whose emitter can be connected to, e.g., an isolation region 550, such as a native buried layer or a deep N well.

It will be appreciated that in the parasitic circuit 530, the collector of the first NPN parasitic BJT 542 and the base of the second PNP parasitic BJT 538 will are connected to each other, and the collector of the second PNP parasitic BJT and 538 and the base of the first NPN parasitic BJT 542 are connected to each other such that, the first NPN parasitic BJT 542 and the second PNP parasitic BJT 538 form a cross-coupled parasitic PNPN SCR 546. The parasitic SCR 546 can arise from structures such as isolation structures (e.g., a native-doped buried layer or a deep N well) and substrate regions and can be undesirable. Accordingly, the structures that give rise to the parasitic PNPN SCR 546 may be configured such that they do not become activated in operation. Still referring to FIG. 5, the bidirectional protection device 500 may have a back-gate diode 548, which can be electrically connected to the substrate region 554 and to the T1.

Figure 6A:
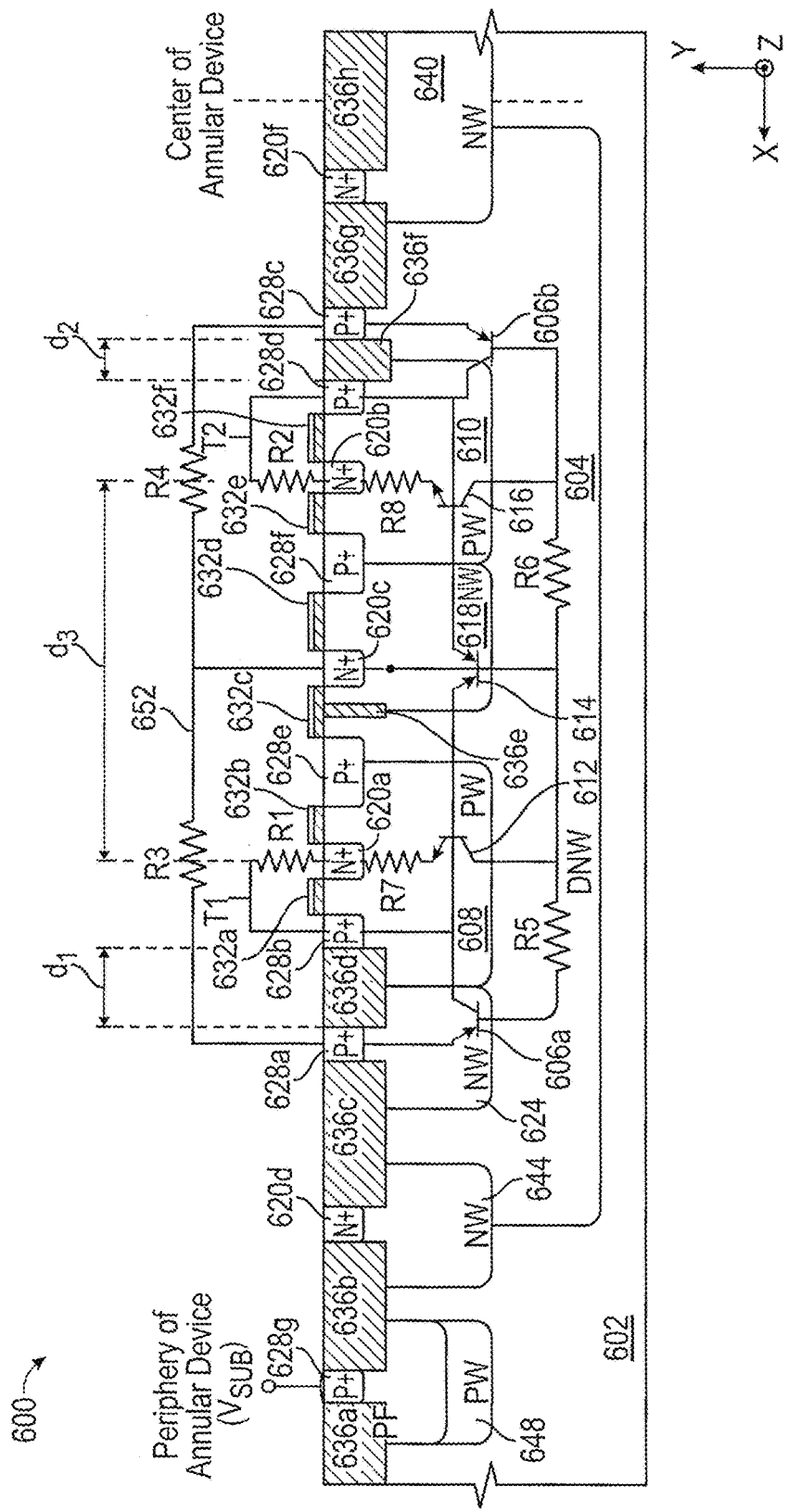
FIG. 6A is a schematic cross-sectional view of a bidirectional protection device having a triggering device and a gain-controlled bidirectional SCR, according to embodiments.
Figure 6B:
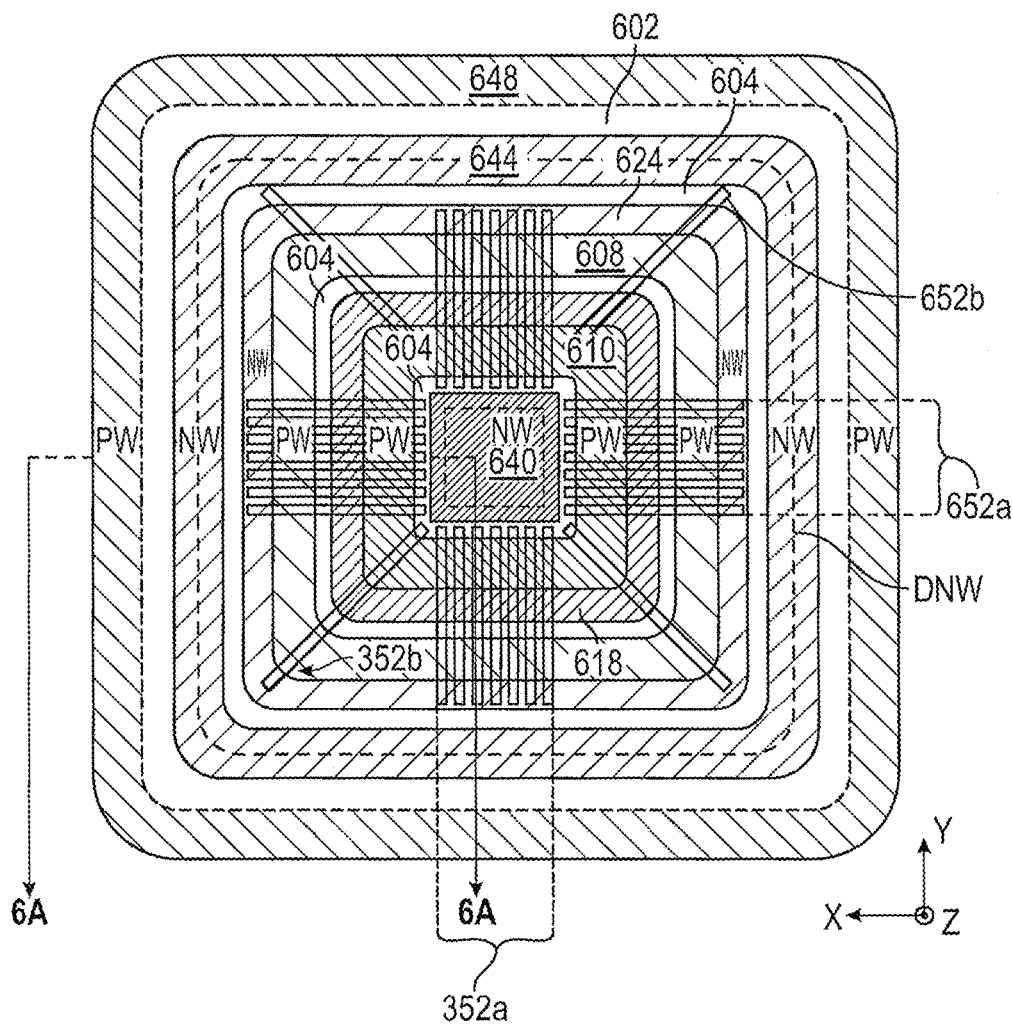
FIG. 6B is a top-down view of the bidirectional protection device illustrated in FIG. 6B.

FIGS. 6A and 6B are a cross-sectional and top down views, respectively, of a bidirectional protection device 600 having an integrated triggering device, according to some embodiments. The illustrated embodiment is an annular device in which various regions formed in the substrate surround a center region of the annular device, in which FIG. 6A shows a cross section taken along one half of the annular device.

In FIG. 6A, to help better understand the various structural features as they relate to the operation of the bidirectional protection device 600, various structural regions are overlaid with an equivalent circuit diagram. In the following, the various structural features are described first, followed by the corresponding equivalent circuit diagram. The bidirectional protection device 600 includes a semiconductor substrate 602, e.g., a p-type semiconductor substrate, having formed therein a first n-type well (NW) 618 interposed between a first p-type well (PW) 608 and a second p-type well (PW) 610. The first PW 608 has formed therein a first heavily doped n-type ($n^+$) region 620a region that is electrically connected to a first terminal T1 and the second PW 610 has formed therein a second heavily doped n-type ($n^+$) region 620b electrically connected to a second terminal (T2), such that a bidirectional semiconductor-controlled rectifier (SCR) is formed, where the bidirectional SCR has the first $n^+$ region serving as a cathode/anode (K/A) and the second $n^+$ region serves as an anode/cathode (A/K).

As described herein and throughout the specification, it will be appreciated that the semiconductor substrate 602 can be implemented in a variety of ways, including, but not limited to, a doped semiconductor substrate or a silicon on insulator (SOI) substrate including a silicon-insulator-silicon structure in which the various structures described above are isolated from a support substrate using an insulator layer such as a buried $SiO_2$ layer. In addition, it will be appreciated that the various structures described above can be at least partially formed in an epitaxial layer formed at or near a surface region.

In the illustrated embodiment, first PW 608 is laterally separated from the first NW 618 by a gap, while the second PW 610 contacts the first NW 618 to form a junction therebetween. However, other embodiments are possible, e.g., where the first PW 608 and the first NW 618 can contact each other to form a junction therebetween, and/or where the second PW 610 and the first NW 618 is separated, depending on the desired device characteristics, as discussed more in detail infra.

As used herein, a junction or a junction region refers to a region formed when two semiconductor material of different types form an interface, and can include regions near the interface where the electronic bands (i.e., conduction and valence bands) are bent due to built-in electric fields. Thus, the dimension of a junction region can depend on various factors such as the doping concentrations and the doping profiles of the different types of semiconductor materials forming the junction.

Still referring to FIG. 6, the bidirectional protection device 600 includes a deep N well (DNW) 604 disposed below, e.g., immediately below or in contact with bottom ends of one or more of the first NW 618, the first PW 608 and the second PW 610. In some embodiments, the DNW 604 forms junction regions with the first and second PWs 608, 610 vertically in the y direction while forming a vertical extension of an n-type region from the first NW 618. In embodiments where the first PW 608 and the first NW 618 are laterally separated from each other, and/or where the second PW 610 and the first NW 618 are laterally separated from each other, the DNW 604 can fill the respective gap formed between separated regions. For example, in FIG. 6A, the first PW 608 and the first NW 618 are separated by the DNW 604 such that the DNW 604 can also form a lateral extension region from the first NW 618.

Still referring to FIG. 6A, the first $n^+$ region 620a, the first PW 608, the first NW 618, the second PW 610 and the second $n^+$ region 620b are electrically connected such that an NPNPN bidirectional SCR is formed. The bidirectional SCR includes a first PNP bidirectional BJT 614, a first NPN BJT 612 and a second NPN BJT 616 that are electrically connected in an analogous manner to the PNP bidirectional BJT 514, the first NPN BJT 512 and the second NPN BJT 516 described above with respect to FIG. 5.

Still referring to FIG. 6A, the bidirectional protection device 600 further comprises a second n-type well (NW) 624 adjacent the first PW 608. The second NW 624 has formed therein a first heavily doped p-type ($p^+$) region 628a. The first $p^+$ region 628a, the second NW 624 and the first PW 608 are configured as an emitter, a base and a collector of a first triggering PNP BJT 606a. The first PW 608 has formed therein a second heavily doped $p^+$ region 628b, through which the collector of the first triggering PNP BJT 606a is electrically connected to the T1, such that the collector of the first triggering PNP BJT 606a is commonly electrically connected to the T1 with the first $n^+$ region 620a configured as the cathode/anode (K/A) of the bidirectional SCR of the bidirectional protection device 600.

The bidirectional protection device 600 is configured such that the second PW 610 is interposed between the first NW 618 on a first side and the DNW 604 on a second side and in contact therewith. The DNW 604 has formed therein a third heavily doped p-type ($p^+$) region 628c. The third $p^+$ region 628c, the DNW 604 and the second PW 618 are configured as an emitter, a base and a collector of a second triggering PNP BJT 606b. The second PW 610 has formed therein a fourth heavily doped $p^+$ region 628d, through which the collector of the second triggering PNP BJT 606b is electrically connected to the T2, such that the collector of second triggering PNP BJT 606b is commonly electrically connected to the T2 with the second $n^+$ region 620b configured as the anode/cathode (A/K) of the bidirectional SCR of the bidirectional protection device 600.

In the bidirectional protection device 600, while the second $p^+$ region 628b is directly electrically connected to the T1, the first $n^+$ region 620a is electrically connected to the T1 through a first resistor R1. Similarly, while the fourth $p^+$ region 628d is directly electrically connected to the T2, the second $n^+$ region 620b is electrically connected to the T2 through a second resistor R2. R1 and R2 have resistance values such that as connected to the emitters of the first NPN BJT 612 and the second NPN BJT 616, respectively, the emitter injection efficiency and corresponding gains of the respective BJT's can be controllably reduced, thereby increasing the holding voltages of the NPNPN bidirectional SCR, as described supra with respect to FIG. 3C. R1 and R2 are formed above the bidirectional protection device 600 by patterning one or more metallization levels, e.g., first (M1) through $n^{th}$ (Mn) metallization levels, where n can be 2 to 10. Each of the R1 and R2 can be formed of one or more of patterned polysilicon or patterned thin-film metal layers.

The first triggering PNP BJT 606a and the second triggering PNP BJT 606b are further configured such that the respective emitters are electrically connected to the first NW 618 through one or more metallization levels formed above the bidirectional protection device 600. In the illustrated embodiment, the first p+ region 628a is electrically connected to a third heavily doped (n+) region 620c formed in the first NW 618, which can be disposed at a central region of the NPNPN bidirectional SCR, through a third resistor R3 formed at one or more of the metallization levels 652. Analogously, the third p+ region 628c is electrically connected to the third heavily doped (n+) region 620c formed in the first NW 618 through a fourth resistor R4 formed at the one or more of the metallization levels 652. In various embodiments, each of the R3 and R4 has a resistance value between about 0.01 Ohm and about 2000 Ohms, for instance 0.05 about Ohms. Each of the R3 and R4 can be formed of one or more of patterned polysilicon or patterned thin-film metal layers.

Thus, the bidirectional protection device 600 includes: an NPNPN bidirectional SCR including the first n+ region 620a, the first PW 608, the first NW 618, the second PW 610 and the second n+ region 620b; a first triggering device comprising the first triggering PNP BJT 606a including the first p+ region 628a, the second NW 624 and the first PW 608; and a second triggering device comprising the second triggering PNP BJT 606b including the third p+ region 628c, the DNW 604 and the second PW 610. By having the metal emitters of the first and second triggering BJTs 606a and 606b electrically connected to the NPNPN bidirectional SCR through the first NW 618 to provide electrons thereto upon being activated, the NPNPN bidirectional SCR and the first and second triggering devices operate analogously to the bidirectional SCR 504 and the triggering device 522 described above with respect to FIG. 5.

Referring now to FIG. 6B in conjunction with FIG. 6A, the annular configuration of the bidirectional protection device 600 is described. The bidirectional protection device 600 has a third n-type well (NW) 640 disposed at the center of the annular configuration and has formed therein a sixth heavily doped n-type (n+) region 620f. The third NW 640 is successively surrounded by the second PW 610, first NW 618, the first PW 608, the second NW 624, a fourth n-type well (NW) 644 having formed therein a fourth heavily doped n-type (n+) region 620d and a third p-type well (PW) 648 having formed therein a seventh heavily doped p-type (p+) region 628g. The seventh p+ region 628g may be electrically connected, e.g., Kelvin-connected, to the substrate of the main circuitry at $V_{SUB}$, which may be at ground.

It will be appreciated that the third NW 640, the DNW 604 and the fourth NW 644 form a tub-type isolation region laterally and vertically enclosing the first PW 608, the second PW 610, the first NW 618 and the second NW 624. In some embodiments, the tub-type isolation may be electrically floated.

As discussed above, the first and second first trigger PNP BJTs 606a and 606b are electrically connected to the first NW 618 through R3 and R4 formed at one or more of the metallization levels 652. The metallization process architecture of the bidirectional protection device 600 includes a plurality of metallization levels, e.g., first (M1) through $n^{th}$ (Mn) metallization levels, where n can be 2 to 10. As used herein, a metallization level includes laterally extending conductive structures formed of conductive materials, e.g., Cu, Al or W, such as metal lines, that can be patterned using a lithography mask, and also includes vertically extending conductive structures such as vias or contacts formed of conductive materials such as, e.g., Cu, Al or W, that are immediately below the laterally extending conductive structures. Thus, the first metallization level 404 includes the lowest level metal lines above the substrate 602 and vias or contacts made to an n+ or a p+ region (e.g., self-aligned silicide or "salicided" contacts), within a PW or an NW. Similarly, M2 includes next higher level of metal lines above the M1 and vias or contacts made to the M1. M3 to Mn are similarly defined herein to include both lateral lines and vertical connections below them.

In the top down illustration of FIG. 6B, the one or more metallization levels 652 of FIG. 6A are formed of a plurality of metal strips 652a/b extending radially and electrically connected to the second NW 624 through the first p+ region 628a, to the first NW 618 through the third n+ region 620c and to the DNW 604 through the third p+ region 628c, as illustrated in FIGS. 6A/6B. In some embodiments, the metal strips 652a/b are advantageously formed at metal levels below M3, i.e., at metallization levels M1 and/or M2, to minimize the resulting net capacitance while targeting the resistance values of R3 and R4 described above, such that RC delay is minimized to deliver the triggering carriers to the first NW 618. For example, the dimensions and the spacing between adjacent metal strips 652a/652b can be designed such that a net capacitance is lower than about 100 fF, lower than about 50 fF or lower than about 30 fF. In addition, it will be appreciated that the number of the metal strips 652a/652b can be optimized. For example, while 28 (7 per side) metal strips 652a and 4 metal strips 652b are illustrated in FIG. 6B, different arrangements are possible, where there are more or less numbers of the metal strips 652a/b such that the net resistance value of each of R3 and R4 is between about 0.001 Ohms and about 20 Ohms, between for instance 0.05 Ohms.

With continued reference to FIG. 6A, the bidirectional protection device 600 includes plurality of electrically floating metal layers extending laterally in the x-direction and separating some of the adjacent heavily doped (n+ and p+) regions: a first electrically floating metal layer 632a formed on a surface of the first PW 608 and between the second p+ region 628b and the first n+ region 620a; a second electrically floating metal layer 632b formed on the surface of the first PW 608 and between the first n+ region 620a and a fifth p+ region 628e; a third electrically floating metal layer 632c formed on a surface of a junction region between the first NW 618 and the DNW 604 and between the fifth p+ region 628e and the third n+ region 620c; a fourth electrically floating metal layer 632d formed on the surface of the first NW 618 and between the third n+ region 620c and a sixth p+ region 628f; a fifth electrically floating metal layer 632e formed on a surface of the second PW 610 and between the sixth p+ region 628f and the second n+ region 620b; and a sixth electrically floating metal layer 632f formed on the surface of the second PW 610 and between the second n+ region 620b and the fourth p+ region 628d. The electrically floating metal layers are electrically floating because they are not electrically connected to other structures and are separated from the surfaces on which they are formed by a thin dielectric layer. Without being bound to any theory, it will be appreciated that the floating metal layers can allow placement of oppositely doped adjacent n+ and p+ regions at relatively close lateral proximity for high current (e.g., >1×10$^5$ A/cm$^2$) capability of the devices formed by the n+ and/or p+ regions with improved breakdown characteristics therebetween, e.g., due to band-to-band tunneling and/or punch-through effects. This in turn allows for optimization of various BJTs of the bidirectional SCR device for relatively high current and high speed capability, e.g., by enabling shorter base regions of the first NPN BJT 612, second NPN BJT 616 and the bidirectional PNP BJT 614 for optimum transistor efficiency.

Advantageously, the first to sixth electrically floating metal layers 632a to 632f can be formed simultaneously during and using processing steps that form gate stacks of n-FETs (not shown) or p-FETs (not shown) elsewhere in the apparatus (e.g., a core circuit) that is electrically connected to the bidirectional protection device 600. Accordingly, in various embodiments described herein, the floating metal layers are formed on underlying thin dielectrics (e.g., SiO$_2$, SiON, or high K dielectrics) that are deposited or grown to form gate dielectrics (not shown) of the n-FETs and/or p-FETs elsewhere in the integrated circuit. Thus, while not depicted in the Figures for clarity, the floating metal layers do not directly contact the underlying surfaces of the wells on which they are formed, but are vertically interposed by a thin dielectric. In addition, while also not illustrated for clarity, sidewall spacers (e.g., SiN spacers) may be formed on sidewalls of the floating metal layers to insulate the floating metal layers from contacting the adjacent n$^+$ and p$^+$ regions. The underlying gate dielectric layer and sidewall spacers prevent a direct electrical short from forming between adjacent n$^+$ and p$^+$ regions. The thin dielectric layers prevent a silicide formation between the floating metal layers and the underlying well surfaces, and serve to electrically isolate the floating metal layers, which are not electrically connected to any other structure.

When the metal layers are formed with the gates of n-FETs, material that can be used include n-doped semiconductors such as n-doped polycrystalline silicon or a suitable "n-type" metal having a work function $\Phi_{m,N}$ between about 4.1 eV and about 4.65 eV, between about 4.1 eV and about 4.4 eV, or between about 4.4 eV and about 4.65 eV. When the metal layers are formed with gates of p-FETs, materials that can be used include p-doped semiconductors such as p-doped polycrystalline silicon or a suitable "p-type" metal having a work function $\Phi_{m,P}$ between about 4.65 eV and about 5.2 eV, between about 4.65 eV and about 4.9 eV, or between about 4.9 eV and about 5.2 eV.

In various embodiments disclosed herein, suitable metals for the electrically floating metal layers 632a-632f in FIG. 6A include, e.g., aluminum (Al), tungsten (W), titanium (Ti), tantalum (Ta), molybdenum (Mo), rubidium (Ru), TiN, TaN, TaCN, and TaSi$_x$N$_y$, to name a few.

It will be appreciated that the lateral dimensions of each of the electrically floating metal layers 632a-632f are less than about 1 μm, less than about 0.5 μm, less than about 0.2 μm, between about 0.1 μm and about 0.3 μm, or between about 0.06 μm and about 0.2 μm, for instance about 0.16 μm.

Some other adjacent heavily doped (p$^+$ and n$^+$) regions of the bidirectional protection device 600 that are not separated by an electrically floating metal layer may be separated by one of first to eighth dielectric isolations 636a-636h, which can be shallow trench isolation regions. Similar to floating metal layers, dielectric isolations can allow placement of oppositely doped adjacent n$^+$ and p$^+$ regions at relatively close lateral proximity for high current capability. Compared to the floating metal layers, however, dielectric isolation regions can allow for optimization of various BJTs of the bidirectional SCR device for relatively lower speed, e.g., by enabling a longer path length between the adjacent n$^+$ and p$^+$ regions, e.g., a longer path length of the base regions of some BJTs.

Yet some other adjacent heavily doped (n$^+$, p$^+$) regions are separated by both an electrically floating metal layer in addition to a dielectric isolation to provide additional breakdown voltage between adjacent junctions at the expense of longer carrier drift path. For example, the fifth p$^+$ region 628e and the third n$^+$ region 620c are separated by the third electrically floating metal layer 632c and a fifth dielectric isolation 636e. In the illustrated implementation, the fifth dielectric isolation 636e increases the breakdown voltage of the junction between the DNW 604 and the first NW while increasing in the effective base length of the PNP bidirectional BJT 614, such that the triggering voltage of the bidirectional SCR under a positively biased T1 relative to the T2 can be increased in exchange for slower speed.

Various p$^+$ regions and n$^+$ regions disclosed herein can have a peak doping concentration exceeding about 1×10$^{19}$ cm$^{-3}$, exceeding about 1×10$^{20}$ cm$^{-3}$, or in the range between about 1×10$^{20}$ cm$^{-3}$ and about 8×10$^{20}$ cm$^{-3}$, for example, about 2×10$^{20}$ cm$^{-3}$. In addition, various PWs and NWs and the DNW have a peak doping concentration in the range of about 1.5×10$^{16}$ cm$^{-3}$ to about 7.5×10$^{16}$ cm$^{-3}$, for example, about 5.0×10$^{16}$ cm$^{-3}$.

By using a combination of dielectric isolation regions, floating metal layers and optimized lateral dimensions between various structures, the triggering devices and the bidirectional SCR of the bidirectional protection device 600 can be optimized to operate as described above with respect to FIGS. 4A and 5. For example, the fourth dielectric isolation 636d has a lateral length d$_1$ in the x-direction and the sixth dielectric isolation 636f has a lateral length d$_2$ in the x-direction, whose dimensions can be tailored to optimize the first and second triggering PNP BJTs 606a and 606b to be relatively short compared to the lateral dimension d$_3$ of the NPNPN bidirectional SCR, which is the distance between the first n$^+$ region 620a and second n$^+$ region 620b, such that the triggering PNP BJTs 606a and 606b are configured to be activated prior to the activation of the bidirectional SCR, as described above with respect to FIGS. 4A and 5. In various embodiments, each of d$_1$ and d$_2$ are between about 1 μm and about 5 μm, between 2 μm and 4 μm, for instance about 3 μm, while d$_3$ is between about 10 μm and about 30 μm, between about 15 μm and about 25 μm, for instance about 20 μm. In some embodiments, the each of ratios d$_3$/d$_1$ and d3/d2 is between about 3:1 and about 7:1, between about 4:1 and about 6:1, for instance about 5:1.

FIGS. 7A and 7B are an equivalent circuit diagram 700A and a cross-sectional view, respectively, of a bidirectional protection device 700, according to embodiments. In some embodiments, the bidirectional protection device 700 can be an annular device in which various regions formed in the substrate surround a center region of the annular device, similar to the annular configuration described above with respect to FIG. 6B, such that the cross-sectional view of FIG. 7B represents a cross section taken along one half of the annular device. In FIG. 7B, to help better understand the various structural features as they relate to the operation of the bidirectional protection device 700 as a circuit, various structural regions are overlaid with an equivalent circuit diagram similar to the equivalent circuit diagram 700A of FIG. 7A.

Referring to FIG. 7B, the bidirectional protection device 700 has some features that are present in the bidirectional protection device 600 described supra with respect to FIGS. 6A and 6B. For example, the bidirectional protection device 700 includes a semiconductor substrate 602 having formed therein at least three wells, including a first n-type well (NW) 618 interposed between a first p-type well (PW) 608 and a second p-type well (PW) 610. The first PW 608, the second PW 610 and the first NW 618 have formed therein the first, second and third heavily doped n-type (n$^+$) regions 620a, 620b and 620c, respectively. The first PW 608 and the second PW 610 additionally have formed therein second and fourth p$^+$ regions 628b and 628d, respectively. The device 700 additionally includes a second NW 624 formed on the left side of the first PW 608; a third NW 640 formed on the right side of the second PW 610 and having formed therein a sixth n$^+$ region 620f; a fourth NW 744 formed on the left side of the second NW 624 and having formed therein a fourth n$^+$ region 720d; a third PW 748 between the second NW 624 and the fourth NW 744 and having formed therein a seventh p$^+$ region 728g; a fifth NW 752 formed on the right side of the third NW 640 and having formed therein a fifth n$^+$ region 720e; and a fourth PW 756 formed between the third NW 640 and the fifth NW 752 and having formed therein an eighth p$^+$ region 728h. The device 700 additionally includes a DNW 604 arranged as a tub-type isolation well enclosing and contacting at least the bottom regions of the first PW 608, the second PW 610, the first NW 618, the second NW 624 and the third NW 640. Similar to the embodiments described above with respect to FIGS. 6A and 6B, the bidirectional protection devices 700 has a second p$^+$ region 628b formed in the first PW 608, a fourth p$^+$ region 628d formed in the second PW 610, a fifth p$^+$ region 628e formed at a boundary region between the first PW 608 and the DNW 604, and a sixth p$^+$ region 628f formed at a boundary region between the first NW 618 and the second PW 610. The bidirectional protection device 700 also has first to second and fourth to eighth dielectric isolation regions 636a-636b and 636d-636h formed at various positions as shown.

Referring to the bidirectional protection device 700 illustrated with respect to FIG. 7B and the equivalent circuit 700A illustrated with respect to FIG. 7A, similar to the protection device 600 illustrated with respect to FIGS. 6A and 6B, in the first PW 608, the first n$^+$ region 620a is electrically connected to a first terminal (T1), and in the second PW 610, the second n$^+$ region 620b is electrically connected to a second terminal (T2), such that the first n$^+$ region 620a, the first PW 608, the first NW 618, the second PW 610 and the second n$^+$ region 620b are electrically connected between the T1 and T2 and configured as an NPNPN bidirectional SCR. As illustrated in the overlaid equivalent circuit diagram illustrated in FIG. 7B and the equivalent circuit diagram 700B of FIG. 7A, the bidirectional SCR includes a first PNP bidirectional BJT (Q2) 614, a first NPN BJT (Q1) 616 and a second NPN BJT (Q3) 612 that are electrically connected in an analogous manner to the bidirectional protection device 600 illustrated with respect to FIGS. 6A and 6B. As described elsewhere in the specification, the Q1 616 and the Q2 614 are cross-coupled by having the base of one connected to the collector of the other. Similarly, the Q3 612 and the Q2 614 are cross-coupled by having the base of one connected to the collector of the other. It will be appreciated, in the bidirectional protection device 700 and throughout various embodiments described herein, while an SCR may be described as having one type, embodiments are not so limited, and in other embodiments, a similar SCR may be configured as an opposite type. For example, in other embodiments, the first PNP bidirectional BJT (Q2) 614 may be an NPN BJT and the first and second NPN BJTs (Q1, Q3) 616, 612 may be PNP BJTs.

In the illustrated embodiment, first PW 608 is laterally separated from the first NW 618 by a gap formed of a region of the DNW 604, while the second PW 610 contacts the first NW 618 to form a junction therebetween. However, other embodiments are possible, e.g., where the first PW 608 and the first NW 618 can contact each other to form a junction therebetween, and/or where the second PW 610 and the first NW 618 is separated. In a similar manner, any adjacent wells that are illustrated to be laterally separated from each other may contact each other in other embodiments, and conversely, any adjacent wells that are illustrated to be in contact with each other may be separated by an intervening region of DNW 604 in other embodiments.

With continued reference to FIG. 7B, in a similar manner as described above with respect to FIG. 6A, the bidirectional protection device 700 includes plurality of electrically floating metal layers formed on the surface of the substrate 602 while not being conductively connected thereto, and extending laterally in the x-direction to separating some of the adjacent and oppositely heavily doped (n$^+$ and p$^+$) regions. The electrically floating metal layers include: first to fifth electrically floating metal layers 632a-632f. As described supra, the electrically floating metal layers can allow placement of oppositely doped adjacent regions, e.g., adjacent n$^+$ and p$^+$ regions, at relatively close lateral proximity for high current (e.g., >1×10$^5$ A/cm$^2$) and high speed capability of the bidirectional protection devices according to embodiments, while serving an isolation function similar to dielectric isolation regions. Without being bound to any theory, the high current and high speed capability may be provided by, e.g., enabling shorter base regions of the first NPN BJT 612, second NPN BJT 616 and the bidirectional PNP BJT 614 for optimum transistor efficiency. While some adjacent n+ and p+ regions are illustrated as having an electrically floating metal layer formed therebetween, embodiments are not so limited, and in other embodiments, any one or more of the electrically floating metal layers can be replaced with or supplemented with a dielectric isolation region. Similarly, while some adjacent n$^+$ and p$^+$ regions are illustrated as having a dielectric isolation region formed therebetween, embodiments are not so limited, and in other embodiments, any one or more of the dielectric isolation regions can be replaced with or supplemented with an electrically floating metal layer. For example, in other embodiments, the fifth dielectric isolation region 626 may be omitted.

In various embodiments disclosed herein, lateral widths of the first to fifth electrically floating metal layers 632a-632f can be selected, in conjunction with the doping concentrations of the well and heavily doped regions, such that the resulting junctions have high current density capabilities while having high resistance to punch-through effects and band-to-band tunneling. In various embodiments, one or more of, or each of, the first to fifth electrically floating metal layers 632a-632f can have a width that is less than about 1 µm, less than about 0.5 µm, less than about 0.2 µm, between about 0.1 µm and about 0.3 µm, or between about 0.06 µm and about 0.2 µm, for instance about 0.16 µm. These widths can enable a balance between high speed, high current and high resistance to punch-through effects when combined with adjacent p$^+$ regions and n$^+$ region having a peak doping concentration exceeding about 1×10$^{19}$ cm$^{-3}$, exceeding about 1×10$^{20}$ cm$^{-3}$, or in the range between about 1×10$^{20}$ cm$^{-3}$ and about 8×10$^{20}$ cm$^{-3}$, for example, about 2×10$^{20}$ cm$^{-3}$.

In addition to having electrically floating layers as described above, the speed and blocking voltage of the protection device 700 can further be balanced by optimizing a lateral length of the bidirectional NPNPN SCR. In the illustrated embodiment, the lateral length between the first n$^+$ region 620a and the second n$^+$ region 620b can be optimized to be between about 10 µm and about 30 µm, between about 15 µm and about 25 µm, for instance about 20 µm. In addition, the first PW 608 and the second PW 618 have a peak doping concentration in the range of about $1.5 \times 10^{16}$ cm$^{-3}$ to about $7.5 \times 10^{16}$ cm$^{-3}$, for example, about $5.0 \times 10^{16}$ cm$^{-3}$, such that resistances R10 and R11 between bases of the Q3 612 and Q1 616 and T1 and T2, respectively, are between 10Ω and 400Ω, 10Ω and 200Ω or 200Ω and 400Ω, or in a range defined by any of these values.

Some electronic systems, e.g., automotive interfaces, programmable logic controllers, instrument amplifiers and communication interfaces with distributed remote nodes and sensors, may be subject to low input resistance constraints (e.g. <20Ω). These systems may need protection devices to meet many competing needs. At the same time, these systems may have competing needs of protection devices to protect them from high voltage EOS pulses while providing a holding voltage that is high enough to prevent latch-up, while also being configured to respond rapidly to very short transient stresses. For example, some systems may need faster response times and higher holding voltage than can be provided by, e.g., some of the embodiments described above. Thus, in the following, in addition to various features described above, including optimization of the lateral length of the bidirectional SCR and using electrically floating metal layers, additional embodiments are described below, whose protection devices provide compact solutions with a balance between blocking voltage, high current capability, fast response times and sufficient holding voltage, to name a few.

Figure 8A:
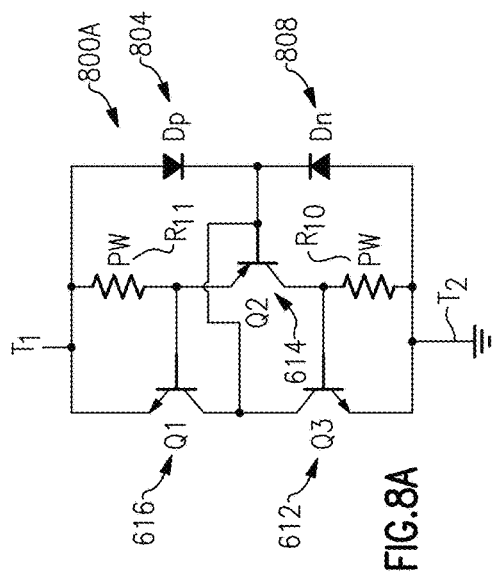
FIG. 8A is an equivalent circuit diagram of a bidirectional protection device having a triggering device comprising diodes, according to embodiments.
Figure 8B:
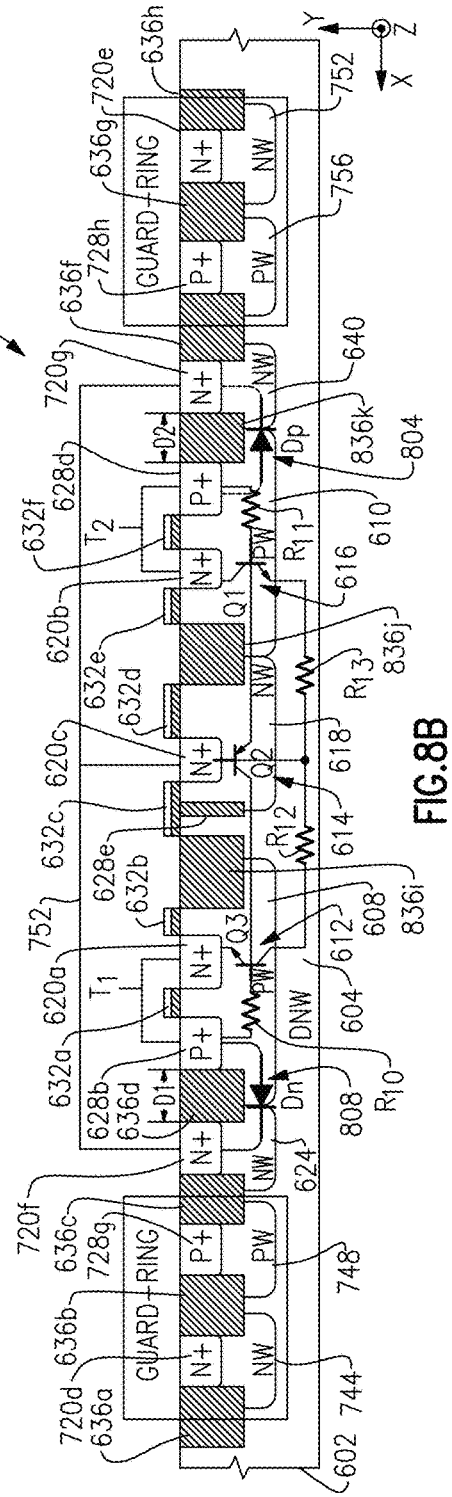
FIG. 8B is a schematic cross-sectional view of the bidirectional protection device illustrated in FIG. 8A, according to embodiments.

FIGS. 8A and 8B are illustrations of a bidirectional protection device 800 having a triggering device comprising diodes, according to embodiments. FIG. 8B illustrates a cross-sectional view of the protection device 800 and FIG. 8A illustrates an equivalent circuit diagram 800A of the bidirectional protection device 800. Some features of the bidirectional protection device 800 are similar to some of the bidirectional protection devices described above, e.g., the bidirectional protection device 700 (FIGS. 7A, 7B), and therefore, in the following, detailed descriptions of some of the overlapping features are omitted.

Referring to FIG. 8B, the bidirectional protection devices 800 includes a semiconductor substrate 602, in which a first NW 618, a first PW 608, a second PW 610, first, second and third n$^+$ regions 620a, 620b and 620c and second and fourth p$^+$ regions 628b and 628d are formed in a similar manner as described above with respect to FIG. 7B. The bidirectional protection device 800 additionally includes a second NW 624, a third NW 640 having formed therein a sixth n$^+$ region 620f, a fourth NW 744 having formed therein a fourth n$^+$ region 720d, a third PW 748 having formed therein a seventh p$^+$ region 728g, fifth NW 752 having formed therein a fifth n$^+$ region 720e, and a fourth PW 756 having formed therein an eighth p$^+$ region 728h and a DNW 604 arranged similarly as the bidirectional device 700 illustrated above with respect to FIG. 7B. Similar to the device 700 (FIG. 7B), the bidirectional protection devices 800 has a second p$^+$ region 628b, a fourth p$^+$ region 628d, first to second and fourth to eighth dielectric isolation regions 636a-636b and 636d-636h. Compared to the protection device 700 described above with respect to FIG. 7B, however, the device 800 omits the fifth p$^+$ region 628e and the sixth p$^+$ region 628f. Instead, the device 800 includes a ninth dielectric region 836i and a tenth dielectric region 836j in regions from which the fifth p$^+$ region 628e and the sixth p$^+$ region 628f are omitted with respect to the bidirectional protection device 700 (FIG. 7B). Additionally, unlike the protection device 700, the device 800 includes a sixth n$^+$ region 720f formed in the second NW 624 and a seventh n$^+$ region 720g formed in the third NW 640. The sixth n$^+$ region 720f is interposed between a third dielectric isolation region 636c and the fourth dielectric region 636d, and the seventh n$^+$ region 720g is interposed between an eleventh dielectric isolation region 836k and the fifth dielectric isolation region 636f.

Similar to the device 700 described above with respect to FIGS. 7A and 7B, in the bidirectional protection device 800 illustrated with respect to FIG. 8B and the equivalent circuit 800A illustrated with respect to FIG. 8A, the first heavily doped n-type (n$^+$) region 620a is electrically connected to a first terminal (T1) and the second heavily doped n-type (n$^+$) region 620b is electrically connected to a second terminal (T2), where formed between the T1 and the T2 are the first n$^+$ region 620a, the first PW 608, the first NW 618, the second PW 610 and the second n$^+$ region 620b configured as an NPNPN bidirectional SCR. The NPNPN bidirectional SCR includes a first PNP bidirectional BJT (Q2) 614, a first NPN BJT (Q1) 616 and a second NPN BJT (Q3) 612 that are cross-coupled and electrically connected in an analogous manner to the bidirectional protection device 700 of FIGS. 7A and 7B. The first n$^+$ region 620a and the second n$^+$ region 620b can serve as an anode (A) and a cathode (K), respectively, or a as a cathode (K) and an anode (A), respectively, depending on the polarity of the transient electrical event.

Still referring to FIG. 8B, functionally in a manner similar to embodiments described above with respect to FIGS. 3A and 4B, the bidirectional protection device 800 includes a triggering device comprising a diode. In the illustrated embodiment, one or more p-type regions of the second p$^+$ region 628b and the first PW 608, and one or more n-type regions of the DNW 604, the second NW 624 and the sixth n$^+$ region 720f are configured as a first triggering diode (Dn) 808, where the one or more p-type regions serv as an anode of the Dn 808, and the one or more n-type regions serve as a cathode of the Dn 808. The first n$^+$ region 620a and the second p$^+$ region 628b are both formed in the first PW 608Q4 first NPN BJT 612 and the anode of the Dn 808 are commonly electrically connected to T2.

Still referring to FIG. 8B, in an analogous manner as the configuration of the Dn 808, one or more p-type regions of the fourth p$^+$ region 628d and the second PW 612 and one more n-type regions of the DNW 603, the third NW 640 and the seventh n$^+$ region 720g are configured as a second triggering diode (Dp) 804, where the one or more p-type regions serve as an anode of the Dp 804, and the one or more n-type regions serve as a cathode of the Dp 804. The second n$^+$ region 620b and the fourth p$^+$ region 628d are both formed in the second PW 610, such the emitter of the Q1 616 and the anode of the Dp 804 are commonly electrically connected to T1.

Still referring to FIGS. 8A and 8B, under certain configurations, the regions that form the Dn 808 and/or the regions that form the Dp 804 have physical characteristics such that the Dn 808 and/or Dp 804 behave essentially as avalanche diodes. As described herein, an avalanche diode is a diode that is designed to experience avalanche breakdown at a specified reverse bias voltage. Without being bound to any theory, avalanche breakdown is caused by minority carriers that are accelerated to a high enough velocity such that the accelerated minority carriers ionize the crystal lattice, producing more carriers which in turn create more ionization. In particular, when a current path length D1 between the sixth n$^+$ region 720f and the second p$^+$ region 628b as measured, e.g., by the width of the fourth dielectric isolation 636d is, e.g., less than 5 μm, less than 3.5 μm or less 2 μm, the resulting Dn 808 is configured as an avalanche diode according to embodiments. Similarly, when a current path length D2 between the seventh n$^+$ region 720g and the fourth p$^+$ region 628d is, e.g., less than 5 μm, less than 3.5 μm or less 2 μm, the resulting Dp 804 is configured to serve an avalanche diode according to embodiments. The resulting Dn 808 and Dp 804 can have fast response times, as illustrated infra with respect to, e.g., FIGS. 10A and 10B.

With continued reference to FIG. 8B, in a similar manner as described above with respect to the bidirectional protection device 700 (FIG. 7B), the bidirectional protection device 800 includes plurality of electrically floating metal layers extending laterally in the x-direction and separating some of the adjacent heavily doped (n$^+$ and p$^+$) regions. The electrically floating metal layers include first to sixth electrically floating metal layers 632a-632f which can allow placement of oppositely doped adjacent n$^+$ and p$^+$ regions at relatively close lateral proximity for high current (e.g., >1×10$^5$ A/cm$^2$) and high speed capability, while serving to suppress band-to-band tunneling and punch-through effects, e.g., by enabling shorter base regions of the first NPN BJT 612, second NPN BJT 616 and the bidirectional PNP BJT 614 for optimum transistor efficiency, and by enabling shorter current path lengths D1 and D2, as discussed supra with respect to FIGS. 7A and 7B and infra with respect to FIGS. 10A and 10B.

In operation, when the bidirectional protection device 800 receives a transient electrical signal, e.g., an EOS signal, between T1 and T2, depending on the polarity of the transient electrical signal, a combined turn-on voltage of the pair of diodes Dn 808, Dp 804 can be approximately, or proportional to, the sum of a forward threshold or turn-on voltage of a forward-biased one of Dn 808 and Dp 804, and a reverse breakdown voltage of a reverse-biased one of the Dn 808 and Dp 804. As described above, by optimizing the D1 and D2, the combined turn-on voltage of the pair of diodes Dn 808, Dp 804 can be correspondingly adjusted for a particular purpose. The inventors have found that, without being bound to any theory, a voltage overshoot of some protection devices during stress conditions is caused by a delay of carrier transport. Advantageously, by disposing the pair of diodes Dn 808, Dp 804 electrically in parallel with the NPNPN bidirectional SCR comprising the first NPN BJT 612, the first PNP BJT 614 and the second NPN BJT 616, where the pair of diodes Dn 808, Dp 804 have relatively short anode-cathode distances, the response or turn on time of the bidirectional protection device 800 can be made much faster, and the resulting voltage overshoot significantly lower, in comparison to bidirectional SCR devices without the pair of diodes Dn 808, Dp 804.

Still referring to FIGS. 8A and 8B, in addition to providing a faster response time through an initial conduction path that is faster than a conduction path through the NPNPN bidirectional SCR, the pair of diodes Dn 808, Dp 804 can speed up the response of the NPNPN bidirectional SCR itself, in part by the electrical connection between the cathodes of the diodes Dn 808, Dp 804 and the base of the first PNP BJT 614 through the one or more metallization levels 752. As illustrated, the sixth n$^+$ region 720f serving at least in part as the cathode of the Dn 808 and the seventh n$^+$ region 720g serving at least in part as the cathode of the Dp 804 are electrically connected to the first NW 618 through the one or more metallization levels 752 formed above the bidirectional protection device 800 formed in the substrate 602. The one or more metallization levels 752 can be formed in a similar manner and have any of the features described above with respect to the one or more metallization levels 652 described above with respect to FIGS. 6A and 6B. For example, while not shown, the one or more metallization levels 752 can serve the third and fourth resistors R3, R4, which can have a resistance value between about 0.01 Ohm and about 2000 Ohms, for instance 0.05 about Ohms, and be formed of one or more of patterned polysilicon or patterned thin-film metal layers. In the illustrated embodiment, the sixth n$^+$ region 720f is electrically connected to the third heavily doped (n$^+$) region 620c formed in the first NW 618, which can be disposed at a central region of the NPNPN bidirectional SCR, through the one or more of the metallization levels 752. Analogously, the seventh n$^+$ region 720f is electrically connected to the third heavily doped (n$^+$) region 620c formed in the first NW 618 through the one or more of the metallization levels 752.

By having the cathodes of the diodes Dn 808, Dp 804 electrically connected to the NPNPN bidirectional SCR through the first NW 618, electrons from the diodes Dn 808, Dp 804 can be provided to the NPNPN bidirectional SCR to accelerate the activation thereof, such that the combination of NPNPN bidirectional SCR electrically connected in parallel with the pair of diodes Dn 808, Dp 804 operates analogously to the bidirectional SCR 404 and the triggering device 442 described above with respect to, e.g., FIG. 4B.

Figure 9:
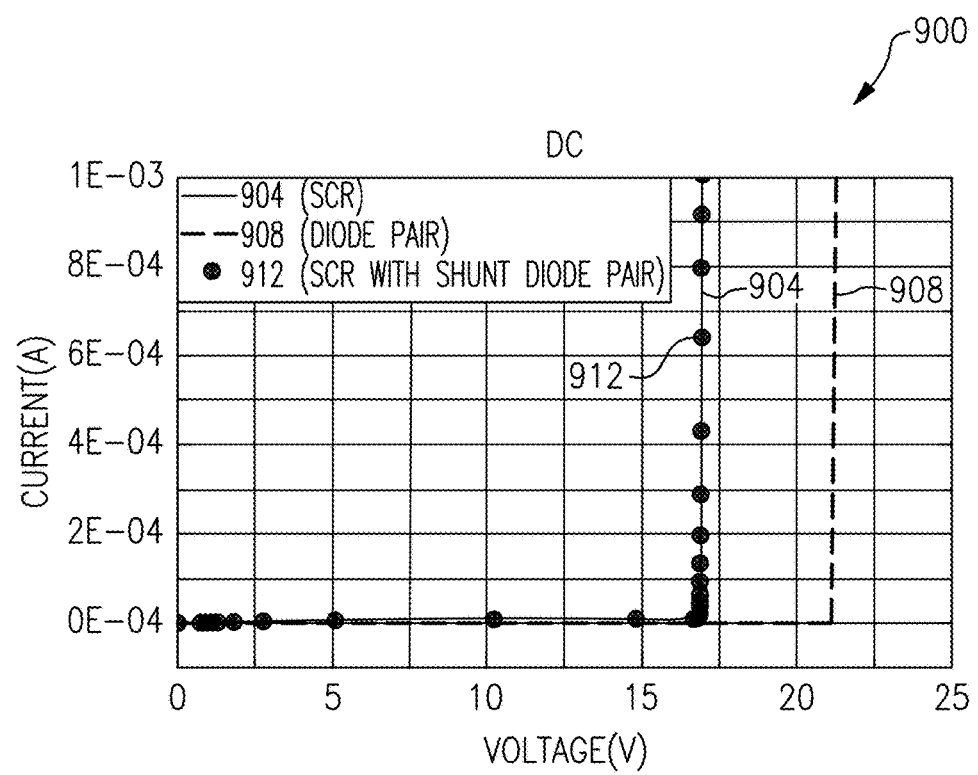
FIG. 9 is a graph illustrating simulated DC current-voltage (IV) curves of bidirectional protection devices having different configurations, according to embodiments.

FIG. 9 is a graph 900 illustrating simulated DC current-voltage (IV) curves of various devices, including IV curves 904, 908, 912 corresponding to the bidirectional protection device 700 (FIGS. 7A/7B), a diode pair similar to the pair of diodes Dn 808, Dp 804 of the bidirectional protection device 800 (FIGS. 8A/8B) and a combination of the NPNPN bidirectional SCR and the pair of diodes Dn 808, Dp 804 similar to the bidirectional protection device 800 (FIG. 8B), respectively. As illustrated by the IV curve 908, the DC breakdown voltage of the pair of diodes in isolation is greater than DC breakdown voltage of the bidirectional SCR under DC conditions. Therefore, when electrically connected in parallel with the NPNPN bidirectional SCR, the pair of diodes has very little influence on the IV curve of the NPNPN bidirectional SCR, as illustrated by the IV curve 912.

Figures 10A, 10B:
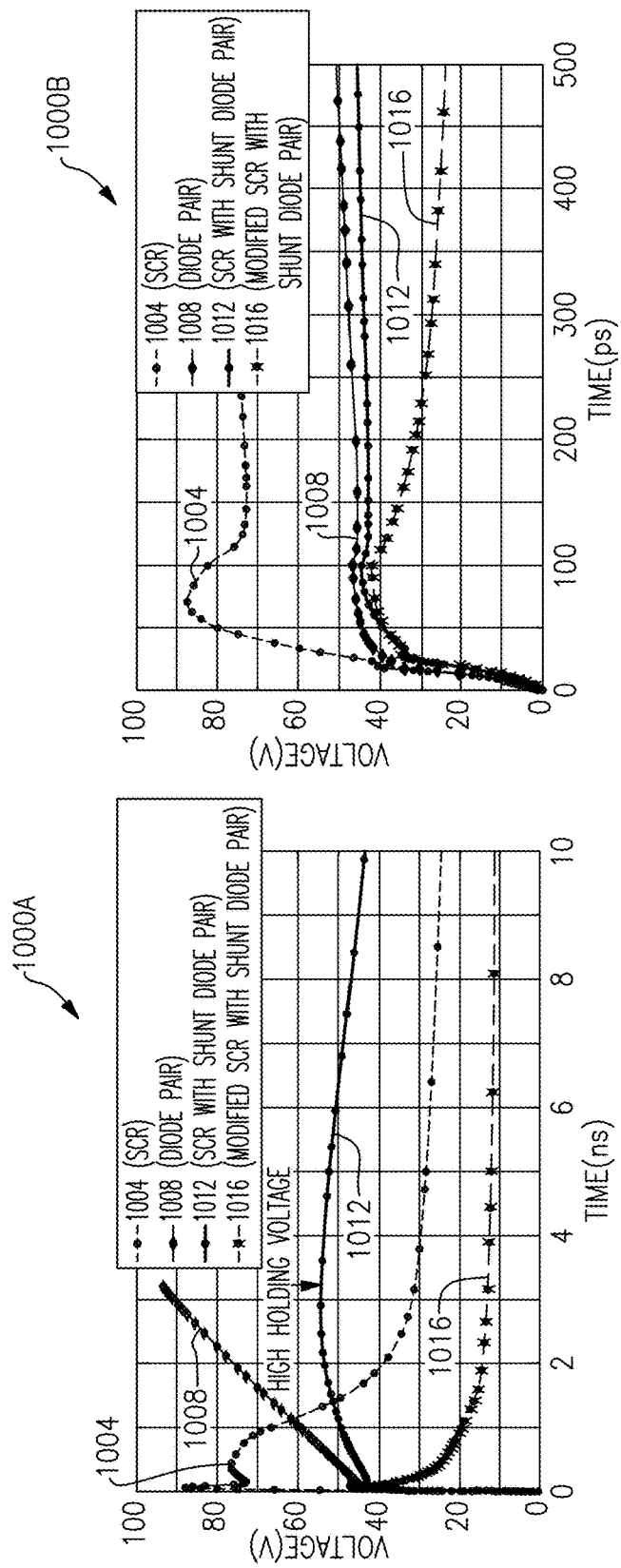
FIG. 10A is a graph illustrating simulated voltage-time (V-t) curves under transmission line pulse (TLP) testing conditions of bidirectional protection devices having different configurations, according to embodiments.
FIG. 10B is a graph illustrating simulated voltage-time (V-t) curves under very fast transmission line pulse (VFTLP) testing conditions of bidirectional protection devices having different configurations, according to embodiments.

FIGS. 10A and 10B are graphs 1000A, 100B illustrating simulated voltage-time (V-t) curves of various devices under transmission line pulse (TLP) testing conditions (current level of 1 A, 100 ps rising time and 10 ns pulse width), including V-t curves 1004, 1008, 1012, 1016 of corresponding to the bidirectional protection device 700 (FIGS. 7A/7B), a diode pair similar to the pair of diodes Dn 808, Dp 804 of the bidirectional device 800 (FIGS. 8A/8B), a combination of the NPNPN bidirectional SCR and the pair of diodes similar to the bidirectional protection device 800 (FIGS. 8A/8B), and a modified combination of the NPNPN bidirectional SCR and the pair of diodes similar to the bidirectional protection device 1200 (FIG. 12A/12B described infra), respectively. The graph 1000A illustrates the voltage response in the time range of 1-10 ns, and the graph 1000B illustrates the voltage response in the time range of 0-500 ps. As illustrated, a peak overshoot voltage of nearly 90V as observed in the V-t curve 1004 between 50 ns and 100 ps is reduced to about 45V in V-t curves 1012 and 1016 corresponding to devices with diodes. In addition, a holding voltage, e.g., at about 2-4 ns, is increased in the V-t curve 1012 relative the V-t curve 1004, but is decreased in the V-t curve 1016 relative to the V-t curve 1004, indicating the tunability of the holding voltage according to structural modifications described herein, e.g., modifications of device structures according to bidirectional protection devices illustrated with respect to FIGS. 7A/7B, 8A/8B and 12A/12B. The tunability of the holding voltage can be advantageous for various reasons. Under some circumstances, a high holding voltage may be desirable to prevent, e.g., latch up. In other circumstances, however, a high holding voltage may not be desirable when the high holding voltage can compromise the device robustness, e.g., deterioration of ESD/EMC protection performance capability due higher Joule heating.

Referring to FIG. 11A, different current paths of a bidirectional protection device 1100 having a triggering device comprising diodes in operation are illustrated, based on simulation, to aid in understanding various electrical responses to a transient electrical event. FIG. 11A illustrates a cross-sectional view of the protection device 1100, which has various regions in the semiconductor substrate 602 that are similarly configured as the protection device 700 described above with respect to FIGS. 7A and 7B. In addition, in a similar manner as the protection device 800 described above with respect to FIGS. 8A and 8B, the protection device 1100 has one or more metallization levels 752 that electrically connect, e.g., connect cathodes of, a first triggering diode (Dn) 808 and a second triggering diode (Dp) 804. In particular, the bidirectional protection device 1100 includes the first n+ region 620a, the first PW 608, the first NW 618, the second PW 610 and the second n+ region 620b configured as an NPNPN bidirectional SCR. The protection device 1100 additionally includes one or more p-type regions of the second p+ region 628b and the first PW 608 and one or more n-type regions of the DNW 604, the second NW 624 and the sixth n+ region 720f configured as a first triggering diode (Dn) 808. In addition to the first n+ region 620a, the first PW 608 has additionally formed therein the second p+ region 628b, such the emitter of the first NPN BJT (Q3) 612 and the anode of the Dn 808 are commonly electrically connected to T2. The protection device 1100 additionally includes one or more p-type regions of the fourth p+ region 628d and the second PW 612 and one more n-type regions of the DNW 603, the third NW 640 and the seventh n+ region 720g configured as a second triggering diode (Dp) 804. In addition to the second n+ region 620b, the second PW 610 has additionally formed therein a fourth p+ region 628d, such the emitter of the second NPN BJT 616 and the anode of the Dp 804 are commonly electrically connected to T1. Based on simulation, the inventors have found that by configuring the protection device to flow certain proportions of currents through different current paths, various parameters including the holding voltage can be controlled. In particular, the different current paths that are formed in the protection device 1100 include a diode path 1104 from the sixth n+ region 720f to the second p+ region 628b through the Dn 808 and from the fifth n+ region 720e to the fourth p+ region 628d through the Dp 804, a NPN path 1108 from the third n+ region 620c to the first n+ region 620a through the first NPN transistor 612 and a bidirectional SCR path 1112 from the fourth p+ region 628d to the first n+ region 620a through the NPNPN bidirectional SCR. Referring back to the equivalent circuit illustrated in FIG. 8A, the second triggering diode Dp 804 is disposed in electrical parallel to the resistor R11 formed in the second PW 616 and in electrical parallel to the emitter-base diode of the PNP transistor (Q2) 614. In response to a transient electrical event, simulated relative percentages of currents through the different current paths 1104, 1108 and 1112 as a function of time are illustrated in FIG. 11B. As illustrated, in the first 10 ns, the percentage of current through the diode path 1104 is relatively high. The inventors have found that this relatively high proportion of current through the diodes Dp 804, Dn 808 leads to a relatively low proportion of current through the NPN path 1108, which in turn leads to a relatively high holding voltage, as described above with respect to FIGS. 10A and 10B (see V-t curve 1012 relative to the V-t curve 1004).

Based on this observed correlation between the relative amount of current through the diode path 1104 and the holding voltage, the inventors have found that the holding voltage can be increased by increasing the relative amount of current through the diode path 1104. In contrast, based on structural modifications described below with respect to FIGS. 12A and 12B, the holding voltage can be lowered.

FIGS. 12A and 12B illustrate a bidirectional protection device 1200 having integrated triggering diodes and configured for lower holding voltages, according to embodiments. FIG. 12B illustrates a cross-sectional view of the protection device 1200 and FIG. 12A illustrates an equivalent circuit diagram 1200A of the bidirectional protection device 1200. Some features of the bidirectional protection device 1300 are similar to the bidirectional protection device 800 (FIGS. 8A, 8B), and therefore, in the following, a detailed description of some of the similar features are omitted.

Referring to FIG. 12B, the protection device 1200 has various regions in the semiconductor substrate 602 that are similarly positioned and configured as the bidirectional protection device 800 described above with respect to FIG. 8B except, in the protection device 1200, the third n+ region 620c is omitted and in its place, a central p+ region 1220 is formed in the first NW 618. The resulting equivalent circuit is illustrated in FIG. 12A. Similar to the device 800 described above with respect to FIGS. 8A and 8B, the bidirectional protection device 1200 comprises an NPNPN bidirectional SCR which includes a first PNP bidirectional BJT (Q2) 614, a first NPN BJT (Q1) 616 and a second NPN BJT (Q3) 612 that are electrically connected in an analogous manner to the bidirectional protection device 800 (FIGS. 8A/8B). The first n+ region 620a and the second n+ region 620b can serve as an anode (A) and a cathode (K), respectively, or a as a cathode (K) and an anode (A), respectively, of the NPNPN bidirectional SCR, depending on the polarity of the transient electrical event.

Still referring to FIG. 12B, unlike the device 800 described above with respect to FIGS. 8A and 8B, the presence of the central p+ region 1220 forms a second PNP BJT (Q4) 1208 and a third PNP BJT (Q5) 1204. For the Q4 1208, the central p+ region 1220 is configured as an emitter, the first NW 618 and the DNW 604 are configured as a base, and the first PW 608 is configured as a collector. For the Q5 1204, the central p+ region 1220 is configured as an emitter, the first NW 618 and the DNW 604 are configured as a base, and the second PW 610 is configured as a collector. Referring to the equivalent circuit illustrated in FIG. 12A, the second triggering diode Dp 804 is disposed in electrical parallel to the resistor R11 formed in the second PW 616 and in electrical parallel to a first NPNP SCR formed by the Q2 614 and the Q1 616, where each one the Q2 614 and Q1 616 has a base connected to a collector of the other of the Q2 614 and Q1 616. As configured, the first NPNP SCR is in electrical parallel with a second NPNP SCR formed by the Q1 616 and the Q5 1204, where each one the Q1 616 and the Q5 1204 has a base connected to a collector of the other of the Q1 616 and the Q5 1204. Thus, the Q1 616 forms a common NPN BJT that is shared between the first and second NPNP SCRs. Similarly, the first triggering diode Dn 808 is disposed in electrical parallel to the resistor R10 formed in the first PW 608 and in electrical parallel to a third NPNP SCR formed by the Q2 614 and the Q3 612, where each one the Q2 614 and Q3 612 has a base connected to a collector of the other of the Q2 614 and Q3 612. As configured, the third NPNP SCR is also in electrical parallel with a fourth NPNP SCR formed by the Q4 612 and the Q4 1208, where each one the Q3 612 and the Q4 1208 has a base connected to a collector of the other of the Q3 612 and Q4 1208. Thus, the Q2 616 forms a common NPN BJT that is shared between the third and fourth NPNP SCRs.

Still referring to FIG. 12B, similar to the device 800 (FIGS. 8A/8B), the bidirectional protection device 1200 comprises a first triggering diode (Dn) 808, where the emitter of the first NPN BJT 612 and the anode of the Dn 808 are commonly electrically connected to T2, and further comprises a second triggering diode (Dp) 804, where the emitter of the second NPN BJT 616 and the anode of the Dp 804 are commonly electrically connected to T1. Due to the presence of the Q5 1204 and the resulting second NPNP SCR formed by cross-coupled Q1 616 and Q5 1204 that is in electrical parallel with the Dp 804, compared to the protection device 800 (FIGS. 8A/8B), a relatively smaller amount of current flows through the Dp 804 in the protection device 1200 in response to transient electrical events. Similarly, due to the presence of the Q4 1208 and the resulting fourth NPNP SCR formed by cross-coupled Q3 612 and Q4 1208 that is in electrical parallel with the Dn 808, compared to the protection device 800 (FIGS. 8A/8B), a relatively smaller amount of current flows through the Dn 808 in the protection device 1200 in response to transient electrical events. The effect of the relatively lower amount of current flowing through the Dp 804 and the Dn 808 on the device behavior of the protection device 1200 is further described below with respect to FIGS. 13A and 13B.

Figure 12C:
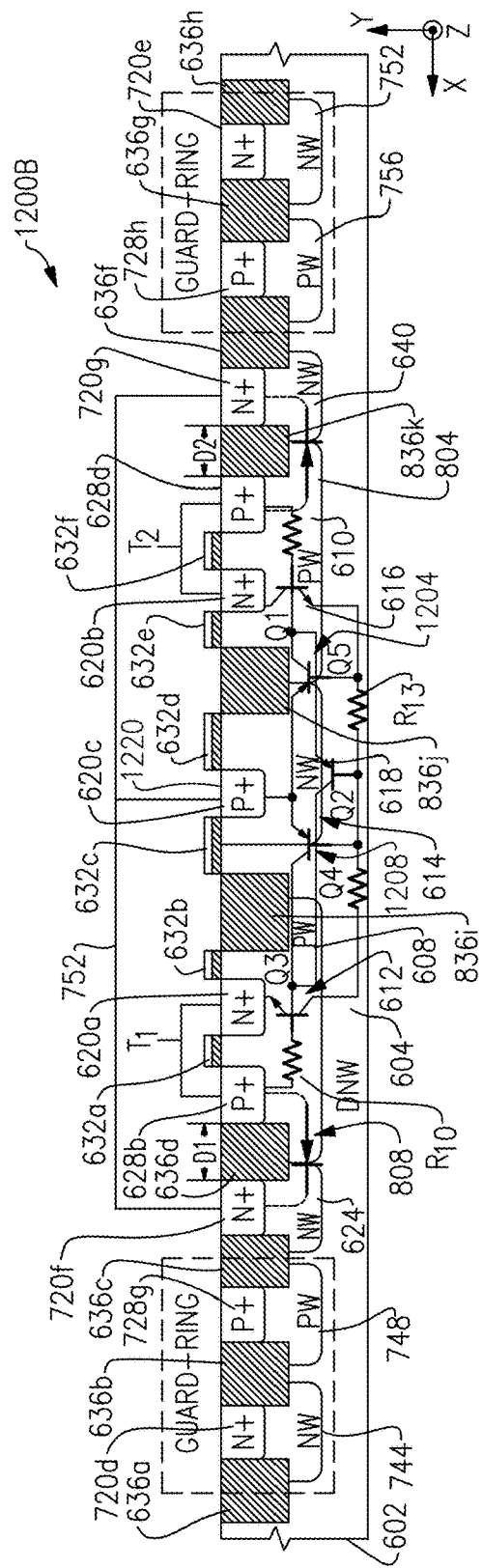
FIG. 12C is a schematic cross-sectional view of the bidirectional protection device, illustrated in FIG. 12A, according to alternative embodiments.

FIG. 12C illustrates a bidirectional protection device 1200B, according to embodiments. The protection device 1200B is identical to the protection device 1200 illustrated with respect to FIG. 12B, except that the fifth dielectric isolation 636e is omitted from the first NW 618. In a similar manner as described above with respect to FIG. 8B, the bidirectional protection device 1200B includes plurality of electrically floating metal layers extending laterally in the x-direction and separating some of the adjacent heavily doped (n$^+$ and p$^+$) regions: first to sixth electrically floating metal layers 632a-632f which can allow placement of oppositely doped adjacent n$^+$ and p$^+$ regions at relatively close lateral proximity for high current and high speed capability, in a similar manner as discussed supra with respect to FIGS. 8A and 8B. In various embodiments, the electrically floating metal layers provides the high current and high speed while also providing electrical isolation effects, similar to dielectric isolation regions. Thus, in the illustrated embodiment, the electrically floating metal layers 632a-632f do not laterally overlap with a dielectric isolation region.

Figure 13A:
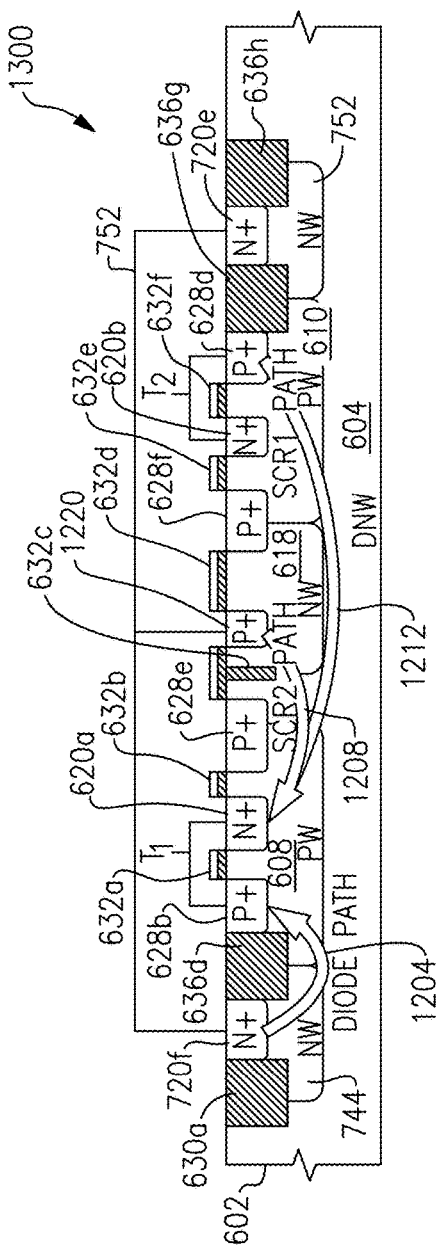
FIG. 13A is a schematic cross-sectional view of a bidirectional protection device having a triggering device comprising diodes and a plurality of SCR current paths, according to embodiments.
Figure 13B:
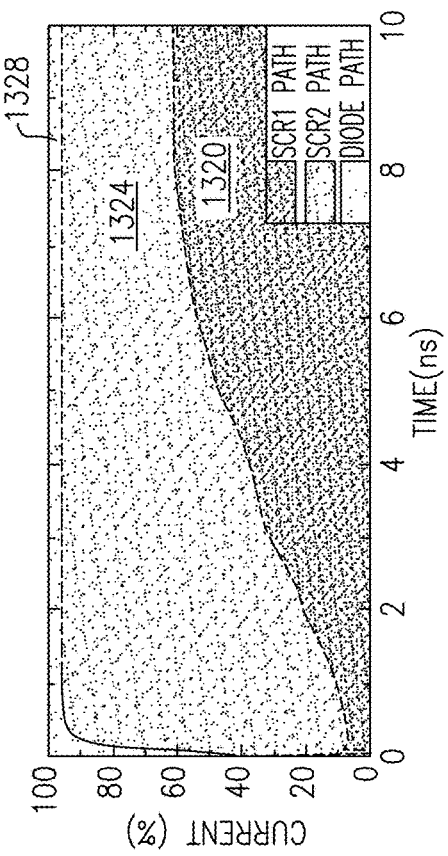
FIG. 13B illustrates relative proportions of simulated currents flowing through different current paths in the bidirectional protection device illustrated in FIG. 13A.

FIG. 13B illustrates different current paths of a bidirectional protection device 1300 in operation, based on simulations. FIG. 13A illustrates a cross-sectional view of the bidirectional protection device 1300, which has various regions in the semiconductor substrate 602 that are similarly configured as the bidirectional protection device 1100 described above with respect to FIG. 11A except, in the protection device 1300, the third n$^+$ region 620c is omitted and in its place, a central p$^+$ region 1220 is formed in the first NW 618, in a similar manner as the bidirectional protection device 1200 (FIGS. 12A/12B). As a result, different current paths that are formed in the protection device 1300 include a diode path 1304 and a SCR path 1312 similar to the diode path 1104 and the SCR path 1112 described above with respect to FIG. 11A. However, unlike the NPN path 1108 described above with respect to FIG. 11A, the device 1300 includes a second SCR path 1308 through the central p$^+$ region 1220, the first NW 618, DNW 604, the first PW 608 and the first n$^+$ region 620a. As described above with respect to FIGS. 12A and 12B, the presence of the central p$^+$ region 1220 forms a second PNP BJT (Q4) 1208 and a third PNP BJT (Q5) 1204. As a result, a first NPNP SCR comprising the Q2 614 and the Q1 616 is in electrical parallel with a second NPNP SCR comprising the Q1 616 and the Q5 1204, and a third NPNP SCR comprising the Q2 614 and the Q3 612 is also in electrical parallel with a fourth NPNP SCR comprising the Q3 612 and the Q4 1208. Due to the presence of the Q5 1204 and the resulting second NPNP SCR formed by cross-coupled Q1 616 and Q5 1204 that is in electrical parallel with the Dp 804, compared to the protection device 800 (FIGS. 8A/8B), a relatively smaller amount of current flows through the Dp 804 in the protection device 1200. Similarly, due to the presence of the Q4 1208 and the resulting fourth NPNP SCR formed by cross-coupled Q3 612 and the Q4 1208 that is in electrical parallel with the Dn 808, compared to the protection device 800 (FIGS. 8A/8B), a relatively smaller amount of current flows through the Dn 808 in the protection device 1200. The effect of the relatively lower amount of current flowing through the Dp 804 and the Dn 808 is illustrated in FIG. 13B. In response to a transient electrical event, simulated relative percentages of currents through the different current paths 1304, 1308 and 1312 as a function of time are illustrated in FIG. 13B. As illustrated, in the first 10 ns, the percentage of current through the diode path 1304 is relatively low compared to the diode path 1104 described above for the protection device 1100 with respect to FIG. 11A. The inventors have found that, in comparison to the protection devices 800 (FIGS. 8A/8B) and 1100 (FIG. 11A), this relatively low proportion of current through the diodes Dp 804, Dn 808 leads to a relatively high proportion of current through the second SCR path 1308, which in turn leads to a relatively low holding voltage, as described above with respect to FIGS. 10A and 10B (V-t curve 1016). Based on the observed correlation between the amount of current through the diode path 1104 and the holding voltage, the inventor have found that the holding voltage can be lowered by lowering the relative amount of current through the diode path 1104, by forming the central p$^+$ region 1220 and the resulting secondary SCRs, as illustrated with respect to FIGS. 12A and 12B.

FIGS. 14A and 14B show graphs 1400A (linear scale) and 1400B (logarithmic scale) illustrating overlaid experimental current-voltage (IV) curves under transmission line pulse (TLP) testing conditions. The graph 1400A shows IV curves 1404, 1408, 1412 of a NPNPN bidirectional SCR similar to the NPNPN bidirectional SCR of the device 800 (FIGS. 7A/7B), a combination of the NPNPN bidirectional SCR and the pair of diodes similar to the device 800 (FIGS. 8A/8B), and a modified combination of the NPNPN bidirectional SCR and the pair of diodes similar to the device 1300 (FIG. 13A/13B) described infra, respectively. As described above with respect to the protection device 800 (FIGS. 8A/8B), when cathodes of the triggering diodes Dp 804, Dp 808 are electrically connected to the third n$^+$ region 636e, the IV curve 1408 displays a holding voltage (e.g., voltage at current less than 2×10$^{-11}$ A) that is higher relative to the holding displayed by the IV curve 1404 corresponding to the protection device 700 (FIGS. 7A/7B) that does not have the triggering diodes Dp 804, Dp 808 whose cathodes are electrically connected to the third n$^+$ region 636e. On the other hand, as described above with respect to the protection device 1300 (FIGS. 13A/13B), when cathodes of the triggering diodes Dp 804, Dp 808 are electrically connected to the central p$^+$ region 1220, the IV curve 1412 displays a holding voltage that is comparable to the holding displayed by the IV curve 1404 corresponding to the protection device 700 (FIGS. 7A/7B), and lower than the holding voltage displayed by the IV curve 1408 corresponding to the protection device 1300 (FIGS. 13A.13B). In contrast to the holding voltage, the protection device 700 (FIGS. 7A/7B), the protection device 800 (FIGS. 8A/8B) and the protection device 1300 (FIGS. 13A/13B) display similar trigger voltages (of approximately 21V), as indicated by the IV curves 1404, 1408 and 1412. This observation suggests, without being bound to any theory, that the trigger voltage may be dominated by the bidirectional NPNPN SCR, instead of the triggering diodes Dp 804, Dp 808 and/or the second and fourth NPNP SCRs comprising the cross-coupled Q2 614 and the Q5 1204 and the cross-coupled Q2 614 and Q4 1208.

Figure 15B:
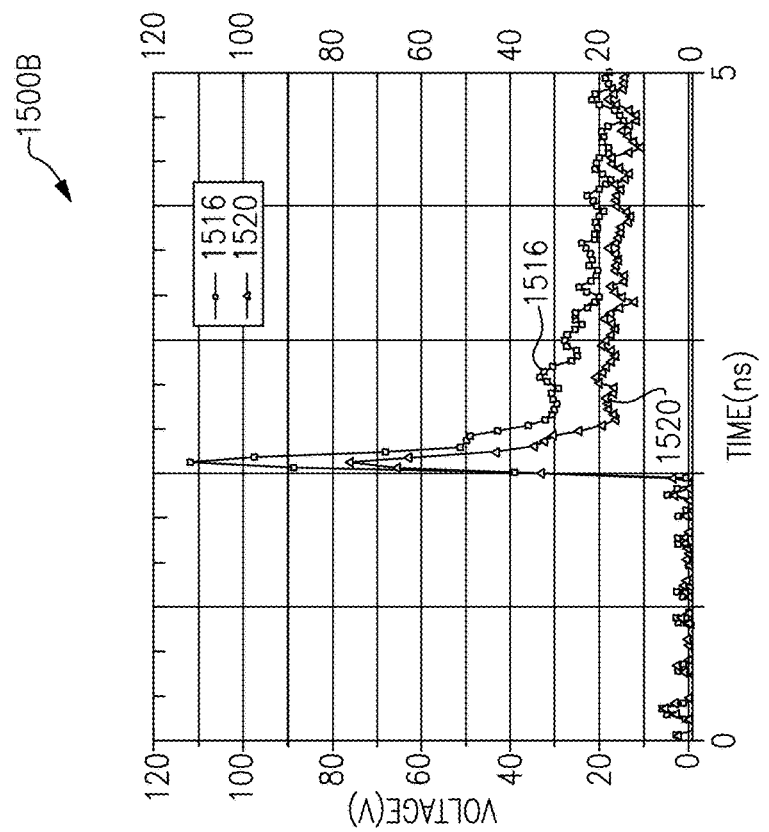
FIG. 15B is a graph illustrating experimental voltage-time (V-t) curves under very fast transmission line pulse (VFTLP) testing conditions of bidirectional protection devices having different configurations, according to embodiments.
Figure 15A:
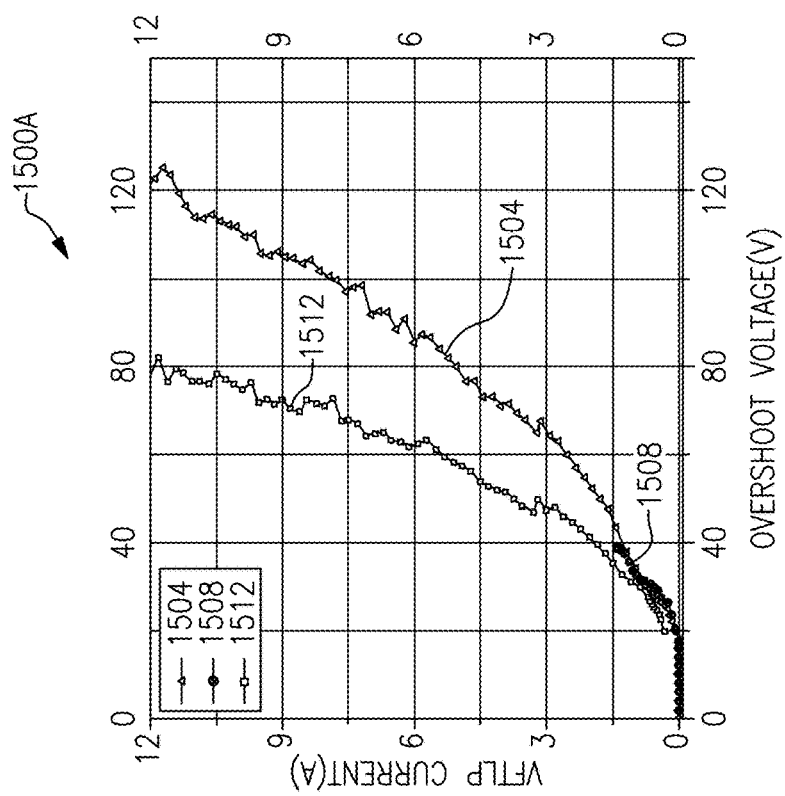
FIG. 15A is a graph illustrating experimental current-voltage (IV) curves under very fast transmission line pulse (VFTLP) testing conditions of bidirectional protection devices having different configurations, according to embodiments.

FIG. 15A is a graph 1500A illustrating experimental current-voltage (IV) curves measured under very fast transmission line pulse (VFTLP) testing conditions. The graph 1500A shows IV curves in linear scale 1504, 1508, 1512 of a NPNPN bidirectional SCR similar to the NPNPN bidirectional SCR of the device 800 (FIGS. 7A/7B), a combination of the NPNPN bidirectional SCR and the pair of diodes similar to the device 800 (FIGS. 8A/8B), and a modified combination of the NPNPN bidirectional SCR and the pair of diodes similar to the device 1300 (FIG. 13A/13B) described infra, respectively. Comparing the IV curve 1512 with the IV curve 1504, the VFTLP test result shows a significant decrease in overshoot voltage resulting when cathodes of the triggering diodes Dp 804, Dp 808 are electrically connected to the central p$^+$ region 1220. Furthermore, due to the lower clamping voltage and lower holding voltage, the proposed IV curve 1512 corresponding to the protection device 1300 (FIGS. 13A/13B) shows a higher robustness under VFTLP testing compared to the IV curve 1508 corresponding to the protection device 800 (FIGS. 8A/8B).

FIG. 15B is a graph 1500B illustrating experimental voltage-time (V-t) curves measured under very fast transmission line pulse (VFTLP) testing conditions. Comparing the V-t curve 1520 corresponding to the protection device 1300 (FIGS. 13A/13A) with the V-t curve 1516 corresponding to the protection device 700 (FIGS. 7A/7B), the VFTLP test result shows a significant decrease in overshoot voltage and faster turn-on speed which results when cathodes of the triggering diodes Dp 804, Dp 808 are electrically connected to the central p$^+$ region 1220.

In the embodiments described above, apparatus, systems, and methods for wear-out monitors are described in connection with particular embodiments. It will be understood, however, that the principles and advantages of the embodiments can be used for any other systems, apparatus, or methods with a need for protection from transient electrical events. In the foregoing, it will be appreciated that any feature of any one of the embodiments can be combined and/or substituted with any other feature of any other one of the embodiments.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," "infra," "supra," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All suitable combinations and subcombinations of features of this disclosure are intended to fall within the scope of this disclosure.

What is claimed is:

1. An integrated circuit device, comprising:
 a first bipolar junction transistor (BJT);
 a second BJT cross-coupled with the first BJT to operate as a first semiconductor-controlled rectifier (SCR), wherein a base of the first BJT is connected to a collector of the second BJT, and a base of the second BJT is connected to an emitter or a collector of the first BJT;

a triggering device comprising a first triggering device configured to provide a triggering current to the base of the first BJT; and a third BJT cross-coupled with the second BJT to operate as a second SCR, wherein the third BJT has a collector connected to the base of the second BJT and a base connected to the collector of the second BJT.

2. The integrated circuit device of claim 1, further comprising a first well of a first type configured as the base of the first BJT, wherein the first well of the first type is interposed between a first well of a second type configured as the collector of the first BJT and a second well of the second type configured as an emitter of the first BJT, wherein the first well of the first type further has formed therein a first heavily doped region of the second type.

3. The integrated circuit device of claim 2, wherein the first triggering device is connected to the base of the first BJT through the first heavily doped region of the second type.

4. The integrated circuit device of claim 2, further comprising a plurality of metallization levels formed above a semiconductor substrate in which the first BJT, the second BJT, the third BJT, and the triggering device are formed, wherein the first triggering device is electrically connected to the base of the first BJT through one or more of the metallization levels.

5. The integrated circuit device of claim 2, wherein the first well of the second type is further configured as the base of the second BJT, wherein the base of the second BJT is formed between a first heavily doped region of the first type formed in the first well of the second type and configured as an emitter of the second BJT and a deep well of the first type formed under the first well of the second type and configured as the collector of the second BJT.

6. The integrated circuit device of claim 1, further comprising a first terminal (T1) and a second terminal (T2), wherein the first SCR is configured as a bidirectional SCR comprising a cathode/anode (K/A) electrically connected to the T1 and an anode/cathode (A/K) electrically connected to the T2, wherein the integrated circuit device is configured to activate in response to an electrical overstress signal received between the T1 and T2.

7. The integrated circuit device of claim 6, wherein the triggering device comprises a first diode having a cathode electrically connected to the base of the first BJT and a second diode having a cathode electrically connected to the base of the first BJT, and wherein an anode of the first diode is electrically connected to the T1 and wherein an anode of the second diode is electrically connected to the T2.

8. The integrated circuit device of claim 7, further comprising a fourth BJT cross-coupled with the second BJT to operate as a third SCR, wherein the fourth BJT has a collector connected to the base of the second BJT and a base connected to the collector of the second BJT.

9. The integrated circuit device of claim 1, wherein the first triggering device comprises at least one of a triggering diode or a triggering BJT.

10. The integrated circuit device of claim 9, further comprising a first well of a first type configured as the base of the first BJT, wherein the first well of the first type is interposed as the collector of the first BJT and a second well of the second type configured as an emitter of the first BJT, wherein the first well of the second type further comprises a heavily doped region of the first type and a heavily doped region of the second type that are commonly connected to a terminal of the integrated circuit device.

11. An integrated circuit device, comprising:
a semiconductor substrate having formed therein a bidirectional semiconductor-controlled rectifier (SCR), the bidirectional SCR formed between a first terminal and a second terminal, wherein the bidirectional SCR comprises a central well of a first type having formed therein a central heavily doped region of a second type;
one or more metallization levels formed above the semiconductor substrate; and
a pair of triggering devices each electrically connected to the central well of the first type through the one or more metallization levels.

12. The integrated circuit device of claim 11, wherein the bidirectional SCR comprises a first bipolar junction transistor (BJT) having the central well of the first type configured as a base, the bidirectional SCR further comprising a first well of the second type configured as a collector of the first BJT and a second well of the second type configured as an emitter of the first BJT, wherein the central well of the first type is interposed between the first and second wells of the second type.

13. The integrated circuit device of claim 12, wherein the bidirectional SCR further comprises first and second electrically floating metal layers formed on the central well of the first type, wherein the first and second electrically floating layers are laterally interposed by the central heavily doped region of the second type.

14. The integrated circuit device of claim 12, wherein the bidirectional SCR further comprises a second BJT cross-coupled with the first BJT to operate as the bidirectional SCR, wherein a base of the first BJT is connected to a collector of the second BJT, and a base of the second BJT is connected to an emitter or a collector of the first BJT.

15. The integrated circuit device of claim 14, further comprising a deep well of the first type, wherein each of the central well of the first type and first and second wells of the second type is formed in the deep well of the first type.

16. The integrated circuit device of claim 15, wherein the second BJT comprises a heavily doped region of the first type serving as an emitter formed in the first well of the second type, the first well of the second type serving as a base of the second BJT and the deep well of the first type serving as a collector of the second BJT.

17. The integrated circuit device of claim 14, further comprising a third BJT cross-coupled with the second BJT to operate as a second SCR, wherein the third BJT has a collector connected to the base of the second BJT and a base connected to the collector of the second BJT.

18. The integrated circuit device of claim 17, wherein the central heavily doped region of the second type is configured as an emitter of the third BJT, the central well of the first type is configured as a base of the third BJT and the first well of the second type is configured as a collector of the third BJT.

19. The integrated circuit device of claim 11, wherein each of the pair of triggering devices comprises at least one of a triggering diode or a triggering BJT.

20. The integrated circuit device of claim 19, wherein the bidirectional SCR comprises a first bipolar junction transistor (BJT) having the central well of the first type configured as a base, the bidirectional SCR further comprising a first well of the second type configured as a collector of the first BJT and a second well of the second type configured as an emitter of the first BJT, wherein each of the first and second wells of the second type comprises a heavily doped region of the first type and a heavily doped region of the second type.

21. The integrated circuit device of claim 20, wherein the heavily doped regions of the first and second types of the first well of the second type are electrically commonly connected to a first terminal (T1), and wherein the heavily doped regions of the first and second types of the second well of the second type are electrically commonly connected to a second terminal (T2).

22. An integrated circuit device, comprising:
   a semiconductor substrate having formed therein three or more wells comprising a first well of a first type interposed between a first well of a second type and a second well of the second type;
   one or more metallization levels formed above the semiconductor substrate;
   a plurality of bipolar junction transistors (BJTs) formed in the three or more wells and configured to operate as a bidirectional semiconductor-controlled rectifier (SCR) and as a SCR formed in the three or more wells, wherein each of the bidirectional SCR and the SCR comprises a pair of bipolar junction transistors (BJTs), wherein each one of the pair of BJTs has a base connected to a collector of the other of the pair of BJTs;
   a second well of the first type and a third well of the first type formed in the semiconductor substrate and interposed by the three or more wells;
   a first triggering device formed in the second well of the first type and the first well of the second type; and
   a second triggering device formed in the third well of the first type and the second well of the second type,
   wherein the first and second triggering devices are electrically connected to each other through the one or more of the metallization levels.

23. The integrated circuit device of claim 22, wherein the bidirectional SCR and the SCR share a common BJT.

24. The integrated circuit device of claim 23, wherein a cathode of each of the first and second triggering devices are commonly connected to the first well of the first type through the one or more metallization levels.

25. The integrated circuit device of claim 24, wherein a base of the common BJT and an anode of the first triggering device are formed in the first well of the second type.

26. The integrated circuit device of claim 22, further comprising one or more core circuits integrated in the semiconductor substrate to form a system-on-chip (SOC).

* * * * *